United States Patent [19]

Ohe et al.

[11] Patent Number: 5,698,345

[45] Date of Patent: Dec. 16, 1997

[54] PHOTOSENSITIVE RECORDING MATERIAL, PHOTOSENSITIVE RECORDING MEDIUM, AND PROCESS FOR PRODUCING HOLOGRAM USING THIS PHOTOSENSITIVE RECORDING MEDIUM

[75] Inventors: Yasushi Ohe; Hiromitsu Ito; Madoka Yasuike; Yasumasa Toba; Miki Shikano, all of Tokyo, Japan

[73] Assignee: Toppan Printing Co., Ltd., Tokyo, Japan

[21] Appl. No.: 815,432

[22] Filed: Mar. 11, 1997

Related U.S. Application Data

[63] Continuation of Ser. No. 404,765, Mar. 15, 1995, abandoned.

[30] Foreign Application Priority Data

| Mar. 17, 1994 | [JP] | Japan | 6-046742 |
| Jun. 30, 1994 | [JP] | Japan | 6-149796 |
| Jun. 30, 1994 | [JP] | Japan | 6-149797 |
| Jun. 30, 1994 | [JP] | Japan | 6-149798 |

[51] Int. Cl.$^6$ ............................ G03H 1/00; G03H 7/004
[52] U.S. Cl. ...................... 430/2; 430/1; 430/221.1; 430/223.1; 430/230.1; 430/290; 430/291.1; 430/269; 359/1; 359/3; 552/170; 552/25; 552/28; 552/27; 552/29
[58] Field of Search ................ 522/25, 28, 29, 522/27, 170; 430/1, 2, 290, 269, 270.1, 273.1, 271.1, 280.1, 281.1; 359/1, 3

[56] References Cited

U.S. PATENT DOCUMENTS

| 3,658,526 | 4/1972 | Haugh | 430/1 |
| 4,090,936 | 5/1978 | Barton | 430/280.1 |
| 4,428,807 | 1/1984 | Lee et al. | 522/15 |
| 4,717,605 | 1/1988 | Urban et al. | 522/25 |
| 4,836,832 | 6/1989 | Tumey et al. | 51/293 |

(List continued on next page.)

FOREIGN PATENT DOCUMENTS

| 0-344-910 | 12/1989 | European Pat. Off. . |
| 0360869 | 4/1990 | European Pat. Off. . |
| 0 535 828 A1 | 4/1992 | European Pat. Off. . |
| 0 509 512 A1 | 10/1992 | European Pat. Off. . |

(List continued on next page.)

OTHER PUBLICATIONS

Abstract of Database WPI, Section Ch, Week 9320 Derwent Publications Ltd., London, GB; & JP-A-05-094-014, Apr. 16, 1993.

*Primary Examiner*—Martin Angebranndt
*Attorney, Agent, or Firm*— Armstrong,Westerman,Hattori, McLeland & Naughton

[57] ABSTRACT

A photosensitive recording material comprising a solvent-soluble, thermosetting epoxy oligomer capable of cationic polymerization, an aliphatic monomer having at least one ethylenically unsaturated bond, the monomer being liquid at normal temperature and pressure, having a boiling point of 100° C. or above at normal pressure and being capable of radical polymerization, a photoinitiator selected from the group consisting of i) a first photoinitiator capable of simultaneously generating a radical species that activates radical polymerization and a Brønsted acid or Lewis acid that activates cationic polymerization, upon exposure to actinic radiation, and ii) a second photoinitiator comprised of a radical polymerization photoinitiator capable of generating a radical species that activates radical polymerization upon exposure to actinic radiation and a cationic polymerization photoinitiator capable of generating a Brønsted acid or Lewis acid that activates cationic polymerization upon exposure to actinic radiation, and a spectral sensitizer that sensitizes the first photoinitiator or second photoinitiator; the aliphatic monomer being mixed in an amount of from 20 parts by weight to 80 parts by weight based on 100 parts by weight of the thermosetting epoxy oligomer. Use of this photosensitive recording material is effective for producing a volume type phase hologram having superior diffraction efficiency, transparency and weatherability such as thermal resistance and being chemically stable.

15 Claims, 2 Drawing Sheets

U.S. PATENT DOCUMENTS

| | | | |
|---|---|---|---|
| 4,921,827 | 5/1990 | Ali et al. | 502/167 |
| 4,942,102 | 7/1990 | Keys et al. | 430/1 |
| 4,942,112 | 7/1990 | Monroe et al. | 430/1 |
| 5,068,259 | 11/1991 | Noguchi | 522/31 |
| 5,098,803 | 3/1992 | Monore et al. | 430/1 |
| 5,260,149 | 11/1993 | Monore et al. | 430/1 |
| 5,453,340 | 9/1995 | Kawabata et al. | 430/2 |

FOREIGN PATENT DOCUMENTS

| | | | |
|---|---|---|---|
| 0-530-095-A1 | 3/1993 | European Pat. Off. | |
| 0620501 | 10/1994 | European Pat. Off. | 430/2 |
| 3717199A1 | 11/1987 | Germany . | |
| 2-51188 | 2/1990 | Japan . | |
| 5-107999 | 4/1993 | Japan . | |
| 5-94014 | 4/1993 | Japan . | |
| 5-257416 | 10/1993 | Japan | 430/2 |

PHOTOSENSITIVE RECORDING MATERIAL, PHOTOSENSITIVE RECORDING MEDIUM, AND PROCESS FOR PRODUCING HOLOGRAM USING THIS PHOTOSENSITIVE RECORDING MEDIUM

This application is a Continuation of application Ser. No. 08/404,765 filed Mar. 15, 1995, now abandoned.

BACKGROUND OF THE INVENTION

1. Field of the Invention

This invention relates to a photosensitive recording material and a photosensitive recording medium that are used to form a volume type phase hologram, and a process for producing a hologram using such a photosensitive recording medium. More particularly, it relates to a photosensitive recording material and a photosensitive recording medium that have a high sensitivity to visible light, in particular, to argon laser light and electron rays, also have superior weatherability and storage stability and have good hologram characteristic values for, e.g., resolution, diffraction efficiency and transparency, and a process for producing a hologram using such a photosensitive recording medium.

2. Description of the Prior Art

Holograms enable reproduction of three-dimensional stereoscopic images, and hence have been hitherto used in covers of books, magazines or the like, pop art display, gifts and so forth on account of their attractive designability and decorative effect. Holograms can also be said to be equivalent to records of information in submicroscopic units, and hence they are also used as marks for preventing forgery of marketable securities, credit cards and so forth.

In particular, in volume type phase holograms, spatial interference fringes with differences in not optical absorption but in refractive indexes are formed in photosensitive recording mediums, whereby phases can be modulated without absorption of light beams passing through images. Hence, in recent years, they are not only used for display but also expected to be applied in hologram optical elements (HOE) as typified by head-up display (HUD) on the windshield of cars.

Now, recording materials for forming the volume type phase holograms are required to be highly sensitive to laser light having visible oscillation wavelength and besides to show a high resolution. When actually used in forming holograms, they are also required to provide holograms having characteristics such as diffraction efficiency, wavelength reproducibility of reproducing light, band width (half width of a peak of reproducing light) and so forth suited for their purposes. In particular, recording mediums for HUD holograms should preferably have the properties that the diffraction efficiency is 90% or more at spatial frequency of 5,000 to 6,000 lines/m, the half width of a peak of reproducing light (the band width) is 20 to 30 nm and the peak wavelength of reproducing wavelength is within 5 nm of photographing wavelength, and are also required to have a good storage stability over a long period of time.

The general principle concerning the production of holograms is described in some publications and technical books, for example, Junpei TsuJinai, "Holographic Display", Chapter 2, Sangyo Tosho Co. According to these, one beam of a coherent optical system with dual light fluxes, which is commonly a laser, is directed to a recording object, and a photosensitive recording medium as exemplified by a photographic dry plate is placed at a position where the total-reflected light can be received. In addition to the beam reflected from the object, another coherent beam is directed into the recording medium directly without striking the object. The beam reflected from the object is called the object beam, and the beam directed to the recording medium, the reference beam. Interference fringes composed of the reference beam and the object beam are recorded as image information (a hologram). Next, the recording medium having been processed is irradiated by light and viewed at a suitable position, where the light from an illumination source is diffracted by the hologram so as to reproduce the wave front of the reflected light having first reached the recording medium from the object at the time of recording. As a result, an object image similar to an actual image of the object is three-dimensionally seen. Holograms formed by making the object beam and reference beam incident on the recording medium from the same direction are known as transmission holograms. In contrast thereto, holograms formed by making them each other incident from the opposite side of the recording medium are commonly known as reflection holograms. The transmission holograms can be obtained by known methods as disclosed in, for example, U.S. Pat. Nos. 3,506,327 and No. 3,894,787. The reflection holograms can be obtained by known methods as disclosed in, for example, U.S. Pat. No. 3,532,406.

As a value for comparing holographic characteristics of holograms formed as images, refractive index modulation is used. This is a value calculated from the measured diffraction efficiency and recording medium thickness, the former being the proportion of incident light diffracted by a diffraction grating which is prepared while directly irradiating a recording medium in the manner that dual light fluxes are at the same angles to the recording medium. The refractive index modulation is a quantitative measure of the changes in refractive index that occur at exposed areas and unexposed areas of a volume hologram, i.e., the portions where light rays interfere with one another to become strong or weak in intensity, and can be found by the Kogelnik's theoretical formula (Bell. Syst. Tech. J., 48, 2909, 1969). In general, the reflection holograms have more interference fringes formed per 1 mm than the transmission holograms and hence make it difficult to carry out recording, so that it is difficult to obtain a high refractive index modulation.

As recording materials for such volume type phase holograms, photosensitive materials of bleached silver salt and dichromated gelatin types have been hitherto commonly used. The dichromated gelatin type photosensitive materials are materials most widely used in the recording of volume type phase holograms, because of their high diffraction efficiency and low noise characteristics. Such photosensitive materials, however, have so short a storage lifetime that they must be prepared every time the holograms are produced. Also, since the development is carried out by the wet process, holograms may undergo deformation in the course of swell and shrink of the gelatin required when holograms are produced. Hence, such materials have the problem that holograms have a poor reproducibility. As for the silver salt photosensitive materials, they require complicated processing after recording, and they are photosensitive materials that can not be satisfactory in view of stability and workability. These aforesaid photosensitive materials also all have the problem that they have inferior environmental properties as exemplified by humidity resistance and weatherability.

To overcome such problems, as materials having superior environmental properties and other properties to be possessed by hologram recording materials, such as a high resolution and a high diffraction efficiency, hologram recording materials making use of poly-N-vinylcarbazole are known in the art. For example, a hologram recording material comprising a cross-linking agent cyclic cis-α-dicarbonyl compound and a sensitizer (Japanese Patent Application Laid-open No. 60-45283), a hologram recording material comprising a 1,4,5,6,7,7-hexachloro-5-norbornene-2,3-dicarboxylic anhydride and a dye (Japanese Patent Application Laid-open No. 60-227280), a hologram recording material comprising 2,3-bornanedione and Thioflavine (Japanese Patent Application Laid-open No. 60-260080), a hologram recording material comprising Thioflavine T and iodoform (Japanese Patent Application Laid-open No. 62-123489) and so forth are proposed. Since, however, these hologram recording materials still also require the wet-process development, they require complicated processing steps and have the problem of a poor reproducibility. Since also they are photosensitive materials mainly composed of poly-N-vinylcarbazole, though being chemically stable and having a high resolution and superior environmental properties, the poly-N-vinylcarbazole tends to turn white upon crystallization, and has the problems that they have a poor reproducibility of transparency and solvents are limited. In addition, they are desired to be more improved in view of sensitivity characteristics.

As recording materials capable of being photocured at a high sensitivity, a photocuring resin composition used in combination of a 3-ketocoumarin dye with a diallyl iodonium salt which are constituents of a photopolymerization initiator (Japanese Patent Application Laid-open No. 60-88005) and also a hologram recording material comprised of such a photopolymerization initiator and a support polymer poly(methyl methacrylate) in combination (Japanese Patent Application Laid-open No. 4-31590) are proposed. These recording materials are chemically stable and have a high resolution and a high sensitivity, but are accompanied by formation of holes or pores on account of wet processing. Hence, they have the problems that the peak wavelength of reproducing wavelength becomes non-uniform, the half width of the peak wavelength expands and also, when developed, uneven development tends to occur because of a more or less resolution of supporting polymers in swelling solvent, and still also the presence of a large number of holes or pores in the hologram results in poor thermal resistance and thermopressure resistance.

As a measure for overcoming such problems, photopolymerization type photosensitive materials that enable production of a hologram through a sole processing step without any wet processing are disclosed in U.S. Pat. Nos. 3,993,485 and 3,658,526. The former discloses two types of photosensitive materials. A first example is a photosensitive resin composition comprised of combination of i) two polymerizable ethylenically unsaturated monomers having different reactivities and refractive indexes with ii) a photopolymerization initiator, as exemplified by a cyclohexyl methacrylate, N-vinylcarbazole and benzoin methyl ether system, which is held between two glass sheets, followed by exposure using a dual light flux optical system to record a hologram. A second example is a photosensitive resin composition comprised of four components, i.e., a polymerizable ethylenically unsaturated monomer and an ethylenically unsaturated monomer acting as a cross-linking agent when the former is polymerized, both having substantially the same degree of refractive index, a non-reactive compound having a different refractive index than the two monomers, and a polymerization initiator, as exemplified by a butyl methacrylate, ethylene glycol dimethacrylate, 1-phenylnaphthalene and benzoin methyl ether system, which can produce a hologram in the same manner as the first example. Whichever photosensitive resin compositions are used, the polymerization of monomers having higher reactivity proceeds at areas where the interference fringes formed by the dual light flux optical system have a strong light intensity and at the same time the density gradation occurs in monomers to cause the monomers with a high reactivity to be diffused in the areas with a strong light intensity and cause the monomers with a low reactivity or non-reactive compounds to be diffused in the areas with a weak light intensity. Thus, the interference fringes are recorded according to differences in refractive indexes to form a volume type phase hologram.

However, such hologram recording photosensitive resin compositions have had the following problems. In the composition shown in the first example, the monomers with a low reactivity undergo polymerization to a certain degree, and no high refractive index modulation can be obtained. In the second example, the non-reactive compound 1-phenylnaphthalene is present in the system as a compound with a low molecular weight even after the hologram has been finished, resulting in no storage stability. Also, in both the examples, since they are mixtures having a low molecular weight and have a low viscosity, they can be held between substrates with difficulty or can form thick films with difficulty, having many problems on workability and reproducibility.

As for the latter U.S. Pat. No. 3,658,526, it discloses a process for producing a stable hologram formed of a hologram recording material comprising a polymer matrix incorporated with a photopolymerizable ethylenic monomer and a photopolymerization initiator, according to which a permanent volume type phase hologram can be obtained by one-time exposure to actinic radiation. The hologram thus formed is fixed by subsequent overall irradiation with actinic radiation. The hologram recording material disclosed in that publication aims at many advantages in view of workability and reproducibility, but has a low diffraction efficiency. In this hologram recording material, the hologram finished has a refractive index modulation ranging from 0.001 to 0.003. As a result, the reproduced images of the hologram formed can only have a limited brightness. The brightness may possibly be improved to a certain extent by increasing the thickness of the hologram recorded layer. This measure to solve the problem, however, consequently forces manufacturers to use hologram recording materials in a large quantity, and also causes a difficulty when holograms are used as fixtures in laminated safety glass as in HUD on the windshield of cars. It should be also noted that the holograms obtained by this process usually cause a decrease in diffraction efficiency after storage for a long time.

Now, improvement techniques including the production of hologram recording materials disclosed in this U.S. Pat. No. 3,658,526 are disclosed in U.S. Pat. Nos. 4,942,112 and 5,098,803. These publications disclose a composition basically consisting of a thermoplastic resin, a polymerizable ethylenically unsaturated monomer and a photopolymerization initiator, where a compound having an aromatic ring is used in either the thermoplastic resin or the polymerizable ethylenically unsaturated monomer in order to improve refractive index modulation, so as to provide a difference in refractive index. Since, however, similar to what is disclosed in U.S. Pat. No. 3,658,526, a resin with a high molecular weight is used as a binder matrix, there is a limit on the diffusibility of monomers at the time of exposure, so that a large amount of exposure becomes necessary and also no high diffraction efficiency can be obtained. To eliminate this disadvantage, a non-reactive plasticizer is added. The use of such a plasticizer, however, causes a problem on the film strength of the hologram formed, and also such a non-reactive plasticizer is present in the system as a compound with a low molecular weight even after the hologram has been finished, resulting in no storage stability. In addition, since the carrier that holds the monomers and so forth is a thermoplastic resin, there is a disadvantage that the hologram has a poor thermal resistance.

As a proposal to eliminate such a disadvantage, Japanese Patent Application Laid-open No. 5-107999 discloses a recording material in which the plasticizer disclosed in the above patent is replaced with a cationic polymerizable monomer and a cationic polymerization initiator so that the problems caused by the non-reactive plasticizer remaining after the formation of holograms can be solved.

This recording material, however, requires a reasonable irradiation with light to fix the hologram after its formation, and also, at the time of fixing, the hologram formed may cause a strain because of diffusion of the cationic polymerizable monomer with a low molecular weight to make it impossible to obtain a high diffraction efficiency. Since also, similar to the prior art thereof, the carrier that holds the monomers and so forth is a thermoplastic resin, there is a disadvantage that the hologram has a poor thermal resistance. Moreover, in a system where no resin binder is used as the carrier for holding them, the recording material can be held between substrates with difficulty because of a low viscosity or can form thick films with difficulty, having many problems on workability and reproducibility.

Under such technical backgrounds, Japanese Patent Application Laid-open No. 5-94014 discloses, as an improvement of the recording materials disclosed in the above U.S. Pat. Nos. 4,942,112 and 5,098,803 and Japanese Patent Application Laid-open No. 5-107999, a hologram photosensitive resin composition comprised of an epoxy resin, a radical polymerizable ethylenically unsaturated monomer and a radical photopolymerization initiator.

So far as seen in Examples disclosed in the above Japanese Patent Application Laid-open No. 5-94014, the hologram photosensitive resin composition makes use of two kinds of epoxy resins. When, however, ultraviolet-curing epoxy resin is used, troublesome operations are required such that the radical polymerization and the cationic polymerization are carried out under light with different wavelength regions, and also, in order to control the diffusibility of monomers, a microadjustment control is required such that the viscosity is increased by preexposure. Thus, this composition still has the problem of difficulties in workability and reproducibility. When thermosetting epoxy resin and a curing agent are used, it takes a reasonable ultraviolet-curing and heating time to cure the epoxy resin for the fixing, resulting in a very poor workability. In addition, the improvement technique disclosed in this publication has a great problem that no high diffraction efficiency can be obtained.

As discussed above, the photopolymerization type photosensitive materials that enable production of a hologram by the sole processing step without any wet processing have the problem on polymerizability and diffusibility of monomers for obtaining a high refractive index modulation and the problem on storage stability caused by the addition of the monomer-holding carrier and the non-reactive additive. In addition, they can not obtain photosensitive recording materials and photosensitive recording mediums having a good workability for producing holograms and good holographic performances such as hologram diffraction efficiency, transparency and reproducibility. Thus, it is still sought to provide a photopolymerizable composition improved for the hologram recording. In particular, it can be said to be natural to do so with regard to HOEs produced using the same.

SUMMARY OF THE INVENTION

The present invention was made taking account of the problems as discussed above. Accordingly, an object of the present invention is to provide a photosensitive recording material and a photosensitive recording medium that are used to form a hologram having superior chemical stability, e.g., environmental resistance, in particular, thermal resistance, produced by dry processing, and having a high resolution, a high diffraction efficiency, a high transparency and a superior reproducing wavelength reproducibility, and to provide a process for producing a hologram using such a photosensitive recording medium.

The photosensitive recording material according to the present invention comprises as main components;

a solvent-soluble, thermosetting epoxy oligomer capable of cationic polymerization;

an aliphatic monomer having at least one ethylenically unsaturated bond, the monomer being liquid at normal temperature and pressure, having a boiling point of 100° C. or above at normal pressure and being capable of radical polymerization;

a photoinitiator selected from the group consisting of i) a first photoinitiator capable of simultaneously generating a radical species that activates radical polymerization and a Brønsted acid or Lewis acid that activates cationic polymerization, upon exposure to actinic radiation, and ii) a second photoinitiator comprised of a radical polymerization photoinitiator capable of generating a radical species that activates radical polymerization upon exposure to actinic radiation and a cationic polymerization photoinitiator capable of generating a Brønsted acid or Lewis acid that activates cationic polymerization upon exposure to actinic radiation; and a spectral sensitizer that sensitizes the first photoinitiator or second photoinitiator;

the aliphatic monomer being mixed in an amount of from 20 parts by weight to 80 parts by weight based on 100 parts by weight of the thermosetting epoxy oligomer.

The photosensitive recording medium of the present invention comprises;

a substrate;

a photosensitive layer formed by coating on the substrate a photosensitive solution comprising the above photosensitive recording material, followed by drying; and an oxygen barrier layer provided on the photosensitive layer.

The process for producing a hologram using this photosensitive recording medium comprises the steps of;

subjecting the photosensitive layer of the above photosensitive recording medium to holographic exposure to form a latent image, substantially directly followed by heating at a temperature of from 60° C. to 120° C. for 1 minute to 30 minutes to produce a volume type phase hologram.

DESCRIPTION OF THE PREFERRED EMBODIMENTS

Figure 1A:
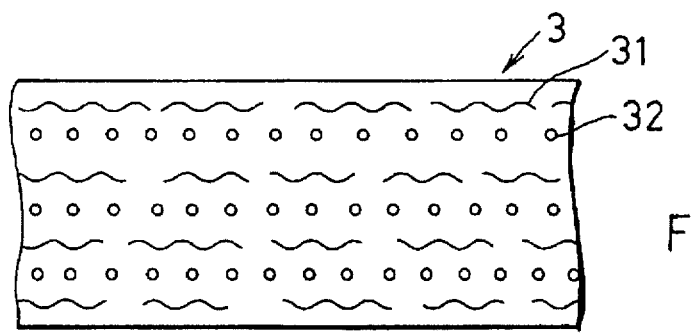
FIGS. 1A to 1D are views to illustrate the reaction mechanism of the photosensitive recording material according to the present invention.

The present invention will be described below in detail.

The photosensitive recording material according to the present invention comprises as main components;

- a solvent-soluble, thermosetting epoxy oligomer capable of cationic polymerization;
- an aliphatic monomer having at least one ethylenically unsaturated bond, the monomer being liquid at normal temperature and pressure, having a boiling point of 100° C. or above at normal pressure and being capable of radical polymerization;
- a photoinitiator selected from the group consisting of i) a first photoinitiator capable of simultaneously generating a radical species that activates radical polymerization and a Brønsted acid or Lewis acid that activates cationic polymerization, upon exposure to actinic radiation, and ii) a second photoinitiator comprised of a radical polymerization photoinitiator capable of generating a radical species that activates radical polymerization upon exposure to actinic radiation and a cationic polymerization photoinitiator capable of generating a Brønsted acid or Lewis acid that activates cationic polymerization upon exposure to actinic radiation; and
- a spectral sensitizer that sensitizes the first photoinitiator or second photoinitiator;

the aliphatic monomer being mixed in an amount of from 20 parts by weight to 80 parts by weight based on 100 parts by weight of the thermosetting epoxy oligomer.

As the above thermosetting epoxy oligomer, it is possible to use;

a thermosetting epoxy oligomer represented by Formula I:

a thermosetting epoxy oligomer represented by Formula III:

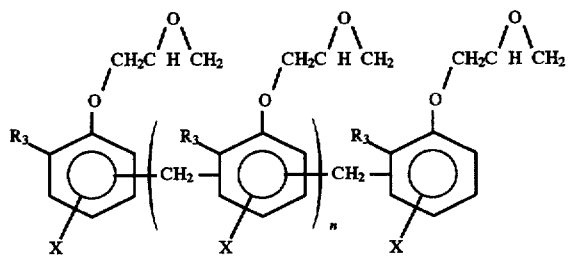

wherein $R_3$ represents a hydrogen atom or a methyl group; X represents a hydrogen atom or a halogen atom; and n is 1 to 20; or a thermosetting epoxy oligomer represented by Formula IV:

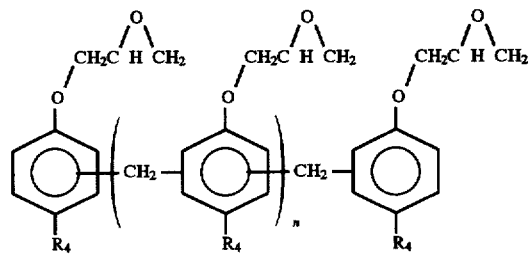

wherein $R_4$ represents an alkyl group; and n is 1 to 20.

It is also possible to use a thermosetting bisphenol-A type epoxy oligomer represented by Formula V:

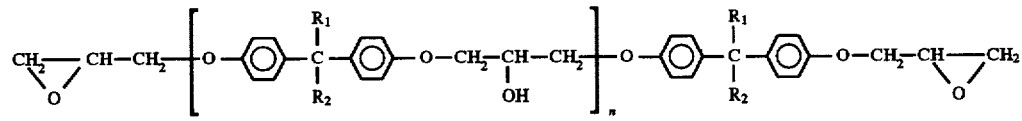

wherein $R_1$ and $R_2$ each represent a hydrogen atom, or a functional group selected from a methyl group, an ethyl group or a trifluoromethyl group; and n is 1 to 20;

a thermosetting epoxy oligomer represented by Formula II:

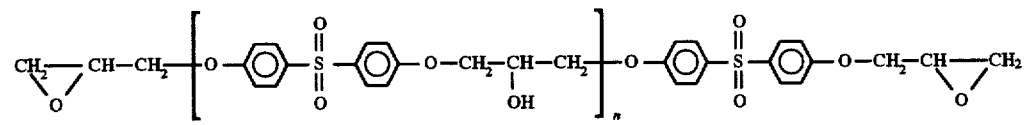

wherein n is 1 to 20;

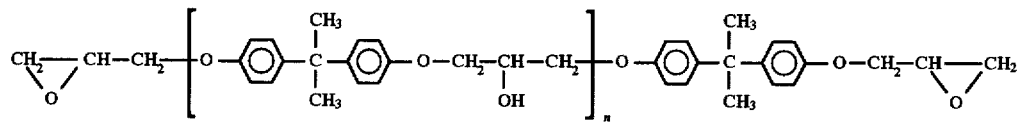

wherein n is 1 to 20;

and having an epoxy equivalent weight of from 400 to 6,000 and a melting point of 60° C. or above.

It is still also possible to use a thermosetting epoxy oligomer such that a hydrogen atom bonded to a phenyl group in the thermosetting epoxy oligomer represented by Formula I or II has been substituted with a halogen atom such as bromine or chlorine, or a thermosetting epoxy oligomer such that a hydrogen atom bonded to a phenyl group in the thermosetting epoxy oligomer represented by Formula V has been substituted with a halogen atom such as bromine or chlorine.

As the aliphatic monomer, it is preferable to use a polyethylene glycol diacrylate or -methacrylate or polypropylene glycol diacrylate or -methacrylate represented by Formula VI:

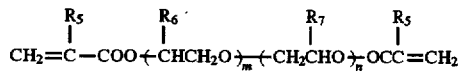

wherein $R_5$ to $R_7$ each represent a hydrogen atom or a methyl group; and m and n are each 0 or more and m+n is 1 to 20.

The first photoinitiator simultaneously generates a radical species that activates radical polymerization and a Brønsted acid or Lewis acid that activates cationic polymerization, upon exposure to actinic radiation. Compounds which can be used as the first photoinitiator may include those selected from iron arene complexes, trihalogenomethyl-substituted s-triazines, sulfonium salts, diazonium salts, diaryliodonium salts, phosphonium salts, selenonium salts and arsonium salts. Specific examples thereof will be shown later.

The second photoinitiator is specifically a photoinitiator mixture comprised of a radical polymerization photoinitiator capable of generating a radical species that activates radical polymerization upon exposure to actinic radiation and a cationic polymerization photoinitiator capable of generating a Brønsted acid or Lewis acid that activates cationic polymerization upon exposure to actinic radiation. Specific examples thereof will be shown later.

The spectral sensitizer that sensitizes the first photoinitiator or second photoinitiator may include organic compounds selected from cyanine or merocyanine derivatives, coumarin derivatives, chalcone derivatives, xanthene derivatives, thioxanthene derivatives, azulenium derivatives, squarilium derivatives, tetraphenylporphyrin derivatives, tetrabenzoporphyrin derivatives and tetrapyrazino derivatives. Specific examples thereof will be shown later.

The photosensitive recording medium of the present invention which is obtained using the photosensitive recording material described above comprises;

a substrate;

a photosensitive layer formed by coating on the substrate a photosensitive solution comprising a photosensitive recording material, followed by drying; the photosensitive recording material comprising as main components a solvent-soluble, thermosetting epoxy oligomer capable of cationic polymerization, an aliphatic monomer having at least one ethylenically unsaturated bond, the monomer being liquid at normal temperature and pressure, having a boiling point of 100° C. or above at normal pressure and being capable of radical polymerization, a photoinitiator selected from the group consisting of i) a first photoinitiator capable of simultaneously generating a radical species that activates radical polymerization and a Brønsted acid or Lewis acid that activates cationic polymerization, upon exposure to actinic radiation, and ii) a second photoinitiator comprised of a radical polymerization photoinitiator capable of generating a radical species that activates radical polymerization upon exposure to actinic radiation and a cationic polymerization photoinitiator capable of generating a Brønsted acid or Lewis acid that activates cationic polymerization upon exposure to actinic radiation, and a spectral sensitizer that sensitizes the first photoinitiator or second photoinitiator; the aliphatic monomer being mixed in an amount of from 20 parts by weight to 80 parts by weight based on 100 parts by weight of the thermosetting epoxy oligomer; and an oxygen barrier layer provided on the photosensitive layer.

The process for producing a hologram according to the present invention, which produces a volume type phase hologram using this photosensitive recording medium, comprises the steps of;

subjecting a photosensitive layer of a photosensitive recording medium to holographic exposure to form a latent image, substantially directly followed by heating at a temperature of from 60° C. to 120° C. for 1 minute to 30 minutes to produce a volume type phase hologram; the photosensitive recording medium comprising;

a substrate;

a photosensitive layer formed by coating on the substrate a photosensitive solution comprising a photosensitive recording material, followed by drying; the photosensitive recording material comprising as main components a solvent-soluble, thermosetting epoxy oligomer capable of cationic polymerization, an aliphatic monomer having at least one ethylenically unsaturated bond, the monomer being liquid at normal temperature and pressure, having a boiling point of 100° C. or above at normal pressure and being capable of radical polymerization, a photoinitiator selected from the group consisting of i) a first photoinitiator capable of simultaneously generating a radical species that activates radical polymerization and a Brønsted acid or Lewis acid that activates cationic polymerization, upon exposure to actinic radiation, and ii) a second photoinitiator comprised of a radical polymerization photoinitiator capable of generating a radical species that activates radical polymerization upon exposure to actinic radiation and a cationic polymerization photoinitiator capable of generating a Brønsted acid or Lewis acid that activates cationic polymerization upon exposure to actinic radiation, and a spectral sensitizer that sensitizes the first photoinitiator or second photoinitiator; the aliphatic monomer being mixed in an amount of from 20 parts by weight to 80 parts by weight based on 100 parts by weight of the thermosetting epoxy oligomer; and an oxygen barrier layer provided on the photosensitive layer.

Thus, the process for producing a hologram according to the present invention, which can produce a bright hologram on account of a high refractive index modulation, can be achieved by carrying out suitable holographic exposure to form a latent image, substantially directly followed by heating at a temperature of from 60° C. to 120° C. for 1 minute to 30 minutes.

Incidentally, the improvement in diffraction efficiency that is attributable to the heat curing of thermosetting epoxy oligomers can not be expected when overall exposure to ultraviolet rays or other actinic radiations such as electron rays, X-rays, visible light rays or infrared rays is carried out after the holographic exposure and before the heat treatment. Also, since in the present invention the high refractive index modulation is attained by the heat treatment, even the refractive index modulation of the level as disclosed in U.S. Pat. No. 3,658,526 can be enough at the time of the holographic exposure, and such a high refractive index modulation as disclosed in U.S. Pat. Nos. 4,942,112 and 5,098,803 is not always necessary.

In the production processes according to the prior art in the above publications, it is explicitly stated that the recording medium is exposed to actinic radiation as a processing step and also that the refractive index of the hologram is controlled in a heating step subsequent to overall exposure. Hence, the photosensitive recording material and hologram production process according to the present invention in which the improvement in diffraction efficiency that is attributable to the heat curing of thermosetting epoxy oligomers can not be expected when overall exposure to ultraviolet rays or other actinic radiations is carried out after the holographic exposure and before the heat treatment, are clearly distinguished from the above prior art.

In the compositional proportion and production process disclosed in Japanese Patent Application Laid-open No. 5-94104, no bright hologram can be obtained at all, compared with the case when the photosensitive recording material according to the present invention is used. Hence, the present invention is also distinguished from the prior art disclosed in Japanese Patent Application Laid-open No. 5-94104.

Figure 1B:
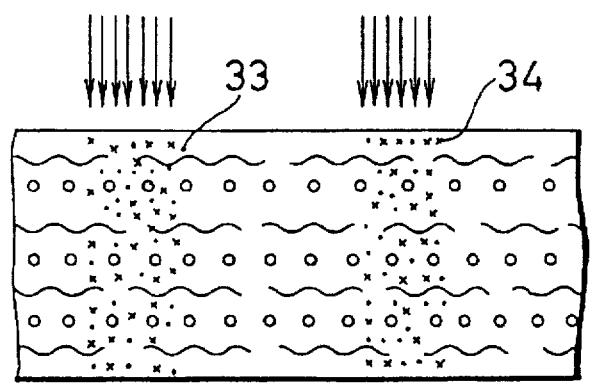

Now, as shown in FIG. 1A, in a photosensitive layer 3 formed of the photosensitive recording material according to the present invention, aliphatic monomers 32 having at least one ethylenically unsaturated bond, being capable of radical polymerization, and solvent-soluble, thermosetting epoxy oligomers 31 capable of cationic polymerization are uniformly distributed. In the hologram recording, upon exposure of this photosensitive layer 3 to laser interference light (i.e., light of the dual light flux optical system), the first photoinitiator or second photoinitiator in the photosensitive recording material simultaneously generates radical species 34 that activate radical polymerization and Brønsted acid or Lewis acid 33 that activates cationic polymerization, at portions undergoing a strong light interference action among laser irradiated portions (FIG. 1B). The radical species 34 generated here cause the aliphatic monomers 32 to undergo radical polymerization. As the monomers become polymerized, the photosensitive recording material causes differences in density in its interior, so that aliphatic monomers 32 move from the neighborhood to that portions. That is, as shown in FIG. 1B, the density of aliphatic monomers 32 becomes higher at the portions undergoing a strong light interference action among laser irradiated portions and the density thereof becomes lower at the portions undergoing a weak light interference action among laser irradiated portions. Thus, differences in refractive index are produced between both the portions to effect hologram recording, as so presumed.

Figure 1C:
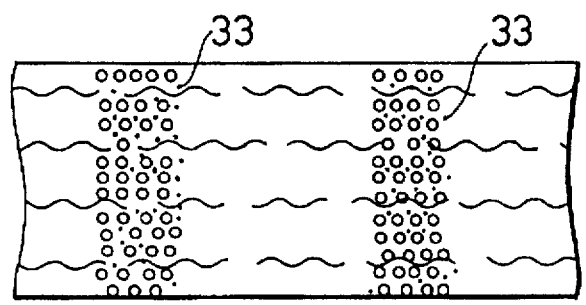
Figure 1D:
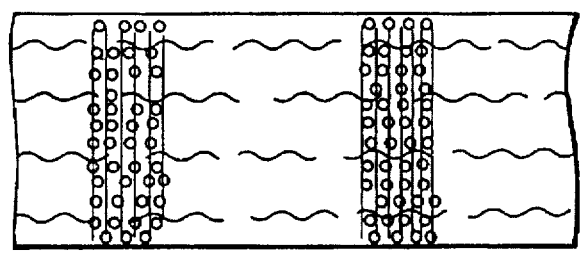

After the exposure to laser interference light, a heat treatment is further applied, whereupon the Brønsted acid or Lewis acid 33 simultaneously generated at the portions undergoing a strong light interference action during the laser interference light irradiation acts to cause the solvent-soluble, thermosetting epoxy oligomers 31 capable of cationic polymerization to undergo the cationic polymerization according to light intensity distribution, so that presumably a structure with different crosslink density is formed (see FIGS. 1C and 1D) and hence this contributes a more increase in the differences in refractive index between the portions undergoing a strong light interference action and the portions undergoing a weak light interference action among the laser irradiated portions, thus making it possible to obtain a volume type phase hologram having a high diffraction efficiency, different from the prior art previously discussed.

The reason why as previously stated the improvement in diffraction efficiency that is attributable to the heat curing of thermosetting epoxy oligomers can not be expected when overall exposure to ultraviolet rays or other actinic radiations is carried out after the exposure to laser interference light and before the heat treatment is presumed that the Brønsted acid or Lewis acid is uniformly generated as a result of the overall exposure and consequently the crosslink density becomes uniform.

The thermosetting epoxy oligomer also serving as an image holding matrix turns to have a cross-linked structure attributable to the cationic polymerization, so that the weatherability of the resulting volume type phase hologram can be improved.

Since also the first photoinitiator or cationic polymerization photoinitiator highly effective for generating the Brønsted acid or Lewis acid is used in combination with the spectral sensitizer, the Brønsted acid or Lewis acid that acts when the thermosetting epoxy oligomer serving as an image holding matrix is made to have a cross-linked structure can be generated in a higher efficiency, so that the diffraction efficiency of the volume type phase hologram after heating can be more improved.

The photosensitive recording material according to the present invention has also a better reproducibility on the peak wavelength of reproducing light and the band width thereof than conventional photosensitive recording materials, and still also has a superior environmental properties. Hence, it can be applied to hologram optical devices.

The present invention will be further described below in greater detail.

Figure 2:
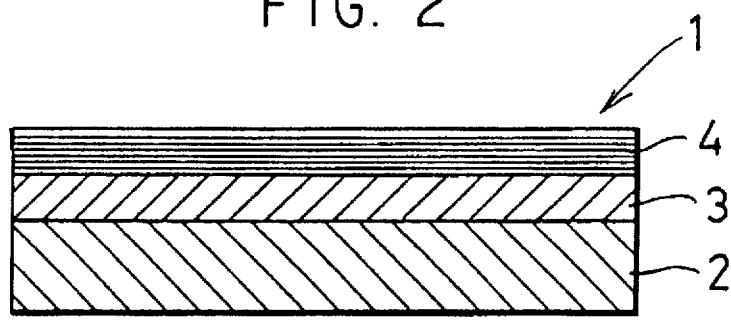
FIG. 2 cross-sectionally illustrates the constitution of the photosensitive recording medium according to the present invention.
Figure 3:
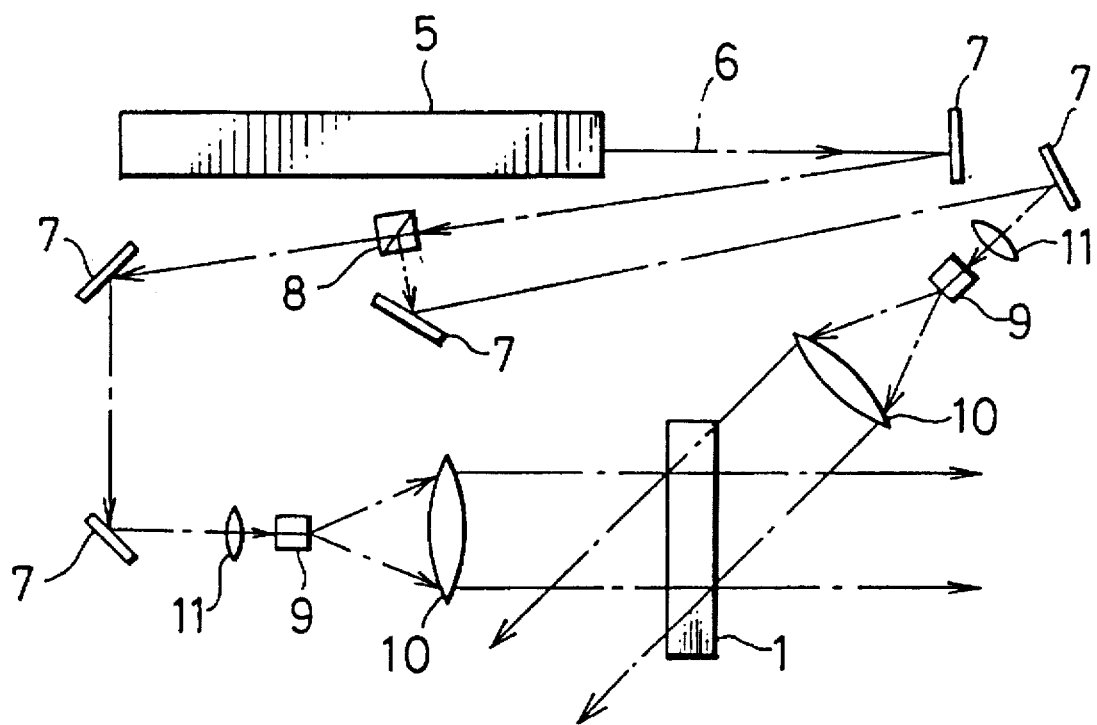
FIG. 3 schematically illustrates a dual light flux optical system used in the photographing for holograms.

FIG. 2 cross-sectionally illustrates the constitution of the photosensitive recording medium according to the present invention. FIG. 3 schematically illustrates a dual light flux optical system used in the photographing for holograms.

The thermosetting epoxy oligomer which is one of constituents of the photosensitive recording material according to the present invention may include the solvent-soluble, thermosetting epoxy oligomer capable of cationic polymerization, represented by Formulas I to IV as previously described. As examples thereof, they include epoxy compounds as shown below, produced by condensation reaction of a phenol compound of various types such as bisphenol-A, bisphenol-AD, bisphenol-B, bisphenol-AF, bisphenol-S, novolak, o-cresol novolak and p-alkylphenol novolak with epichlorohydrin. Examples are by no means limited to these.

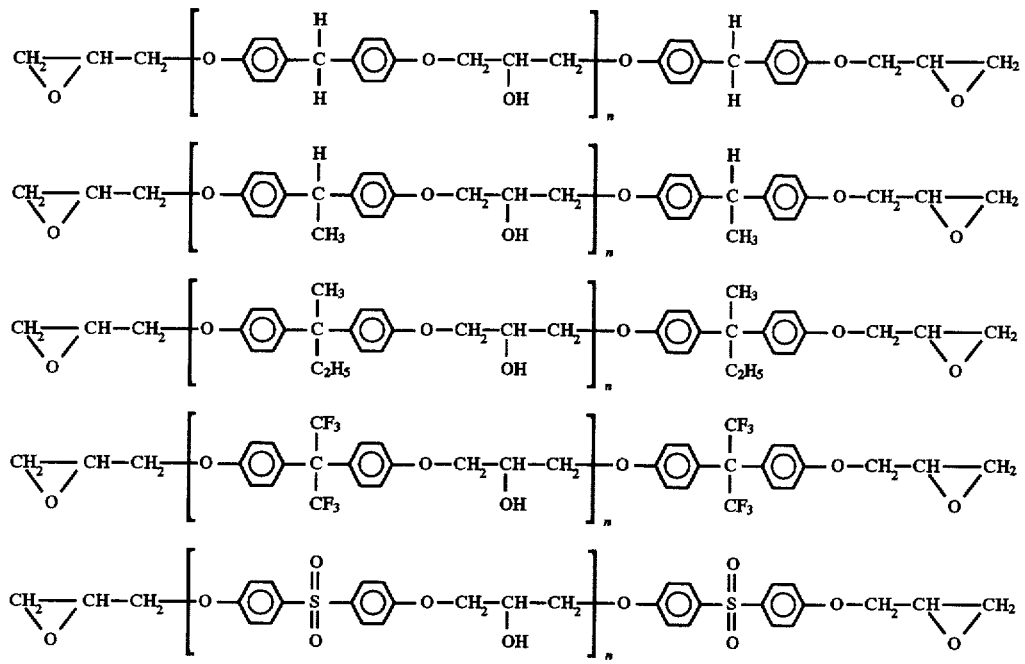

(In the formulas, polymerization degree n is 1 to 20.)

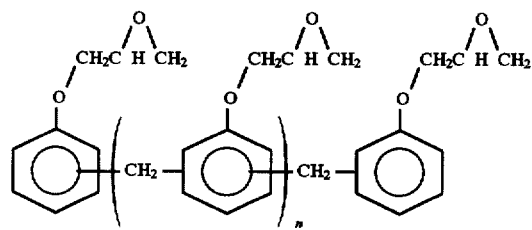

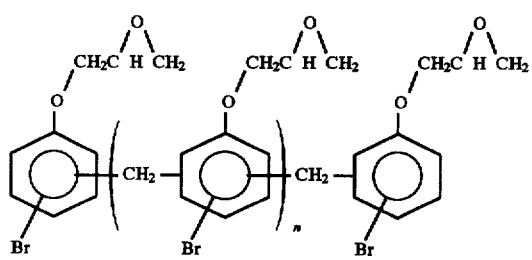

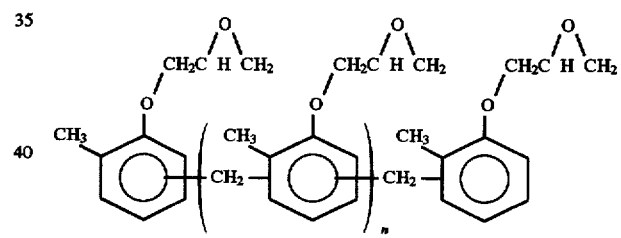

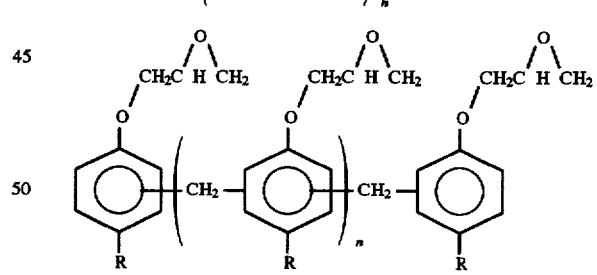

(In the formulas, R represents an alkyl group, and polymerization degree n is 1 to 20.)

It is also possible to use a thermosetting bisphenol-A type epoxy oligomer represented by Formula V:

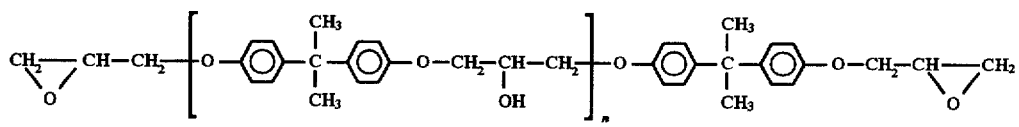

wherein polymerization degree n is 1 to 20; and having an epoxy equivalent weight of from 400 to 6,000 and a melting point of 60° C. or above. As examples thereof, it includes usual commercially available products as typified by EPIKOTE 1001, 1002, 1004, 1007, 1009, 1010 and 1100L, trade names, available from Yuka Shell Epoxy K.K.; ARALDITE 6071, 6084, 6097, 6099 and XAC 5010, trade names, available from CIBA-GEIGY (Japan) Limited; and also D.E.R. 660, 661, 662, 664, 667, 668 and 669, trade names, available from Dow Chemical Japan Ltd. Examples are by no means limited to these.

In particular, the thermosetting epoxy oligomer represented by Formula V must have an epoxy equivalent weight of from 400 to 6,000. Namely, if it has an epoxy equivalent weight of less than 400, the amount of the thermosetting epoxy oligomer necessary for attaining a given viscosity must be increased when a photosensitive solution is prepared, to bring about economical disadvantages, and also no bright holograms tend to be obtained since thermosetting epoxy oligomers may move to a certain extent at the time of fixing, because of its low molecular weight. On the other hand, a thermosetting epoxy oligomer having an epoxy equivalent weight of more than 6,000 usually makes it difficult to be synthesized in a stable molecular weight and a good reproducibility, and makes the diffusibility of monomers poor, resulting in a lowering of sensitivity and no bright holograms obtained. There is another difficulty that no good cationic polymerization may proceed when it is outside this range.

The aliphatic monomer being liquid at normal temperature and pressure, having a boiling point of 100° C. or above at normal pressure and being capable of radical polymerization has at least one ethylenically unsaturated bond in its structural unit, and includes monofunctional vinyl monomers and besides polyfunctional vinyl monomers, or may be mixtures of these. It may specifically include high-boiling point vinyl monomers such as acrylic or methacrylic acid, itaconic acid, maleic acid, acryl- or methacrylamide, diacetone acrylamide and 2-hydroxyethyl acrylate or methacrylate; aliphatic polyhydroxyl compounds as exemplified by di- or polyacrylic or methacrylic esters such as ethylene glycol, diethylene glycol, triethylene glycol, tetraethylene glycol, propylene glycol, dipropylene glycol, tripropylene glycol, tetrapropylene glycol, neopentyl glycol, 1,3-propanediol, 1,4-butanediol, 1,5-pentanediol, 1,6-hexanediol, 1,10-decanediol, trimethylol propane, pentaerythritol, dipentaerythritol, sorbitol and mannitol; and alicyclic monomers such as dicyclopentanyl acrylate and dimethyloltricyclodecane diacrylate. Preferably it may include a polyethylene glycol diacrylate or dimethacrylate or polypropylene glycol acrylate or methacrylate represented by the following Formula VI:

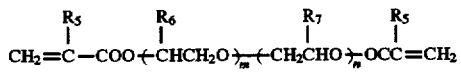

wherein $R_5$ to $R_7$ each represent a hydrogen atom or a methyl group; and m and n are each 0 or more and m+n is 1 to 20.

The first photoinitiator capable of simultaneously generating a radical species that activates radical polymerization and a Brønsted acid or Lewis acid that activates cationic polymerization, upon exposure to actinic radiation, can be exemplified by the compounds disclosed in J. Photopolym. Sci. Technol., 2, 283 (1989), and may specifically include iron arene complexes, trihalogenomethyl-substituted s-triazines, sulfonium salts, diazonium salts, phosphonium salts, selenonium salts, arsonium salts and iodonium salts. The diaryliodonium salts may include the compounds disclosed in Macromolecules, 10, 1307 (1977), as exemplified by chloride, bromide, tetrafluoroborate, hexafluorophosphate, hexafluoroarsenate, aromatic sulfonates or the like of diphenyliodonium, ditolyliodonium, phenyl(p-anisyl)iodonium, bis(m-nitrophenyl)iodonium, bis(p-tert-butylphenyl)iodonium, bis(p-chlorophenyl)iodonium or the like.

As for the second photoinitiator comprised of a radical polymerization photoinitiator capable of generating a radical species that activates radical polymerization upon exposure to actinic radiation and a cationic polymerization photoinitiator capable of generating a Brønsted acid or Lewis acid that activates cationic polymerization upon exposure to actinic radiation, it can be exemplified by the following compounds.

The radical polymerization photoinitiator capable of generating a radical species that activates radical polymerization upon exposure to actinic radiation may include bisimidazole derivatives such as 2,2'-bis(o-chlorophenyl)-4,4',5,5'-tetraphenyl-1,1'-bisimidazole and (2,4,5-triphenyl) imidazole, N-arylglycine derivatives, and organic azide compounds such as 4,4'-diazidochalcone, as well as titanocenes as disclosed in Japanese Patent Application Laid-open No. 61-151197 and aluminato complexes disclosed in Japanese Patent Application Laid-open No. 3-209477. Preferred radical polymerization photoinitiators may include organic peroxides such as 3,3',4',4-tetra(tert-butylperoxycarbonyl)benzophenone, and N-alkoxypyridinium salts such as 1-methoxy-4-phenylpyridinium tetraphenyl borate. Without limitation to these examples, other compounds may be used so long as the above properties are ensured.

The cationic polymerization photoinitiator capable of generating a Brønsted acid or Lewis acid that activates cationic polymerization upon exposure to actinic radiation may include sulfonic esters, imidosulfonates, dialkyl-4-hydroxysulfonium salts, dialkyl-4-hydroxyphenylsulfonium salts, p-nitrobenzylarylsulfonates, and silanol aluminum complexes. Examples thereof include benzoin tosylate, pyrogallol trimesylate, o-nitrobenzyl tosylate, 2,5-dinitrobenzyl tosylate, N-tosylphthalimide, α-cyanobenzylidene tosylamine, and p-nitrobynzyl-9,10-diethoxyanthracene-2-sulfonate. Without limitation to these examples, other compounds may be used so long as the above properties are ensured.

The spectral sensitizer that sensitizes the first photoinitiator or second photoinitiator may include organic compounds such as cyanine or merocyanine derivatives, coumarin derivatives, chalcone derivatives, xanthene derivatives, thioxanthene derivatives, azulenium derivatives, squatilium derivatives and porphyrin derivatives. Besides, the dyes and sensitizers as disclosed in Shinya Ohkawara et al., "SHIKISO HANDOBUKKU (Dye Handbook)", Kodansha Co., 1986; Shinya Ohkawara et al., "KINOUSEI SIKISO NO KAGAKU (Chemistry of Functional Dyes)", CMC Co., 1981; and Chuzaburo Ikemori et al., "TOKUSHU KINOU ZAIRYO (Special Functional Materials)", CMC Co., 1981, may be used. Without limitation to these compounds, other dyes and sensitizers may be used so long as they can absorb light of visible regions. Specific examples thereof are shown below.

As examples of cyanine or merocyanine derivatives, it is preferable to use, but without limitation to, Fluoresceine, Rhodamine, 2,7-dichlorofluoresceine, 3,3'-dicarboxyethyl-2,2'-thiocyanine bromide, anhydro-3,3'-dicarboxyethyl-2,2'-thiocyanine betaine, 1-carboxymethyl-1'-carboxyethyl-2,2'- quinocyanine bromide, anhydro-3,3'-dicarboxyethyl-5,5',9-trimethyl-2,2'-thiacarbocyanine betaine, 3,3'-dihydroxyethyl-5,5'-dimethyl-9-ethyl-2,2'-thiacarbocyanine bromide, anhydro-3,3'-dicarboxymethyl-2,2'-thiocarbocyanine betaine, 2-[3-ethyl-4-oxo-5-(1-ethyl-4-quinolinidene)-ethylidene-2-thiazolinidene-methyl]-3-ethylbenzoxazolium bromide, 3-ethyl-5-[2-(3-ethyl-2-benzothiazolinylidene)-ethylidene]rhodanine, 3-ethyl-5-[2-(3-methyl-2(3H)-thiazolinylidene)-ethylidene]-2-thio-2,4-oxazolinedione, 3-ethyl-5-(3-ethyl-benzothiazolinylidene) rhodanine, 2-(p-diemthylaminostyryl)-3-ethylbenzothiazolium iodide, 2-(p-diethylaminostyryl)-1-ethylpyridinium iodide, and 1,3'-diethyl-2,2'-quinothiacyanine iodide.

As examples of coumarin derivatives, they may include, but are not limited to, 3-(2'-benzimidazole)-7-N,N-diethylaminocoumarin, 3,3'-carbonylbis(7-diethylaminocoumarin), 3,3'-carbonylbiscoumarin, 3,3'-carbonylbis(7-methoxycoumarin), 3,3'-carbonylbis(5,7-dimethoxycoumarin), 3,3'-carbonylbis(6-methoxycoumarin), 3,3'-carbonylbis(7-acetoxycoumarin), 3,3'-carbonylbis(5,7-diisopropoxycoumarin), 3,3'-carbonylbis(5,7-di-n-propoxycoumarin), 3,3'-carbonylbis(5,7-di-n-butoxycoumarin), 3,3'-carbonylbis(7-dimethyaminocoumarin), 7-diethylamino-5',7'-dimethoxy-3,3'-carbonylbiscoumarin), 3-benzoylcoumarin, 3-benzoyl-5,7-dimethoxycoumarin, 3-benzoyl-6-methoxycoumarin, 3-benzoyl-7-methoxycoumarin, 3-benzoyl-8-methoxycoumarin, 3-benzoyl-8-ethoxycoumarin, 3-benzoyl-6-bromocoumarin, 3-benzoyl-7-dimethylaminocoumarin, 3-benzoyl-7-diethylaminocoumarin, 3-benzoyl-7-hydroxycoumarin, 3-acetyl-7-diethylaminocoumarin, 3-acetyl-7-methoxycoumarin, 3-acetyl-5,7-dimethoxycoumarin, 7-dimethylamino-3-(4-iodobenzoyl)coumarin, 7-diethylamino-3-(4-iodobenzoyl)coumarin, and 7-diethylamino-3-(4-diethylaminobenzoyl)coumarin.

As examples of chalcone derivatives, they may include, but are not limited to, the following compounds.

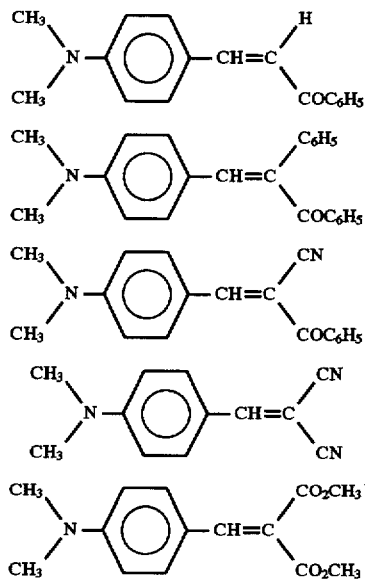

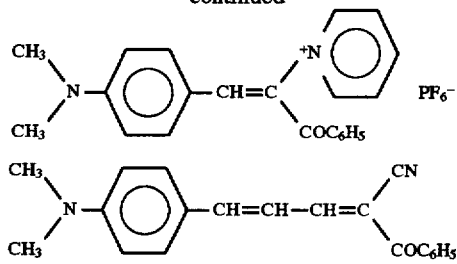

As examples of porphyrin derivatives, it is preferable to use, but without limitation to, 9,10-dihydroporphyrin, 5,9,15,10-tetramethylporphyrin, 4,5,14,15-tetrahydro-4,9,14,19-tetramethyl-2,7,12,17-tetrazaporphyrin, meso-tetraphenylporphyrin, 4,5,9,10,14,15,19,20-octamethylporphyrin, 5,9-diacetyl-4,10,14,15,19,20-hexamethylporphyrin, 5,9-diacetyl-14-ethyl-4,10,15,19,20-pentamethylporphyrin, 4,9,14,19-tetramethyl-5,10,15,20-tetrapropylporphyrin, 2-amino-4,5,9,10,14,15,19,20-octaethylporphyrin, 2-nitro-4,5,9,10,14,15,19,20-octaethylporphyrin, meso-diphenyltetrabenzoporphyrin, 4,5-dibromo-9,10-,14,15-,19,20-tribenzo-2,7,12,17-tetrazaporphyrin, 4,5,9,10,14,15,19,20-octaphenylporphyrin, tetrakis(3,4-dimethoxyphenyl) porphyrin, 4,5,9,10,14,15,19,20-octa(p-methoxyphenyl) porphyrin, and copper, cobalt, nickel, zinc, platinum, magnesium or the like metal complexes thereof.

These spectral sensitizers may be selected so as to be adapted to the wavelengths of radiation sources serving as light sources, according to the purposes for which holograms are used. Depending on their uses, two or more kinds of them may be used in combination.

The photosensitive recording material may be further optionally incorporated with known additives such as a heat polymerization inhibitor, a chain transfer agent and an antioxidant.

The photosensitive recording material according to the present invention comprises, as described above, as main components the solvent-soluble, thermosetting epoxy oligomer capable of cationic polymerization; the aliphatic monomer having at least one ethylenically unsaturated bond, the monomer being liquid at normal temperature and pressure, having a boiling point of 100° C. or above at normal pressure and being capable of radical polymerization; the photoinitiator selected from the group consisting of i) the first photoinitiator capable of simultaneously generating a radical species that activates radical polymerization and a Brønsted acid or Lewis acid that activates cationic polymerization, upon exposure to actinic radiation, and ii) the second photoinitiator comprised of a radical polymerization photoinitiator capable of generating a radical species that activates radical polymerization upon exposure to actinic radiation and a cationic polymerization photoinitiator capable of generating a Brønsted acid or Lewis acid that activates cationic polymerization upon exposure to actinic radiation; and the spectral sensitizer that sensitizes the first photoinitiator or second photoinitiator; where the aliphatic monomer is mixed in an amount of from 20 to 80 parts by weight based on 100 parts by weight of the thermosetting epoxy oligomer, which may particularly preferably be in an amount of from 40 to 70 parts by weight. If it is in an amount less than 20 parts by weight, the quantity of aliphatic monomers which undergo polymerization upon holographic exposure using a laser may become short and hence no high refractive index modulation can be obtained even after the heat treatment, making it impossible to obtain bright holograms. If it is in an amount more than 80 parts by weight, the quantity of aliphatic monomers may become excess, so that no polymerization may take place upon the initial holographic exposure and aliphatic monomers may remain in the system in a large quantity. As the result, in the heat treatment in the production steps, the residual aliphatic monomers may cause polymerization while diffusing, to disturb the interference fringes of holograms once formed, and hence no high refractive index modulation can be obtained to make it impossible to obtain bright holograms.

The first photoinitiator or second photoinitiator may be used in an amount of from 0.1 to 20 parts by weight, and preferably from 1 to 10 parts by weight, based on 100 parts by weight of the thermosetting epoxy oligomer. The spectral sensitizer may be used in an amount of from 0.1 to 10 parts by weight, and preferably from 0.5 to 2 parts by weight, based on 100 parts by weight of the thermosetting epoxy oligomer. The amount of these components is governed by the thickness of the photosensitive layer formed and the optical density of that layer, and hence the amount may preferably be in such a range that the optical density becomes not higher than 2. (Alternatively in terms of transmittance, the amount may preferably be in such a range that the transmittance of irradiation light at the photographing for holograms becomes not less than 1%.) If the amount is outside this range, it becomes difficult to obtain a high diffraction efficiency, also resulting in a lowering of sensitivity characteristics.

Thus, these components are appropriately selected and mixed in the desired proportions to obtain a photosensitive solution, which is then coated in film on a substrate 2 such as a glass plate, a polycarbonate plate, a polymethyl methacrylate plate or a polyester film by a known coating means such as a spin coater, a roll coater or a bar coater to form a photosensitive layer 3. The product thus obtained is the photosensitive recording medium, 1, used in the photographing of holograms according to the present invention (see FIG. 2). On the photosensitive layer 3, a protective layer 4 is further provided as an oxygen barrier layer. In the protective layer 4, the same material as the substrate 2 or an optically transparent material, e.g., a plastic of polyolefin, polyvinyl chloride, polyvinylidene chloride, polyvinyl alcohol or polyethylene terephthalate, or glass, is used, and the layer is superposed so as to hold the photosensitive layer between it and the substrate, or formed by lamination using an extruder or the like or by coating a solution of such a material. When the photosensitive solution is coated, the solution may be optionally diluted with a suitable solvent. In such a case, after coated on the substrate, the coating must be dried. The photosensitive solution may also preferably be prepared in the manner that the transmittance of photographing irradiation light may be not less than 1%.

The solvent that can be used in the present invention is exemplified by dichloromethane, chloroform, acetone, 2-butanone, cyclohexanone, ethyl acetate, 2-methoxyethanol, 2-ethoxyethanol, 2-butoxyethanol, 2-ethoxyethyl acetate, 2-butoxyethyl acetate, 2-methoxyethyl ether, 2-ethoxyethyl ether, 2-(2-ethoxyethoxy)ethanol, 2-(2-butoxyethoxy)ethanol, 2-(2-ethoxyethoxy)ethyl acetate, 2-(2-butoxyethoxy)ethyl acetate, 1,4-dioxane and tetrahydrofuran.

FIG. 3 schematically illustrates a dual light flux optical system used in the photographing for a hologram, where a laser beam 6 is shed from a laser 5, and is directed to the photosensitive recording medium 1 by mirrors 7 and a beam splitter 8 through spatial filters 9 and lenses 10. In the present invention, after the photographing for a hologram is carried out by exposure, the fixing is carried out by a dry process. The present invention can also be applied to the production of transmission holograms, detailed description and illustration of which are herein omitted, and a transmission hologram having a superior holographic performance can be obtained.

When hologram images are recorded in this photosensitive recording medium 1, laser irradiation is applied in accordance with the desired images. More specifically, in the photosensitive layer (photosensitive recording material) 3 of the photosensitive recording medium 1, the aliphatic monomers capable of radical polymerization and the solvent-soluble, thermosetting epoxy oligomers capable of cationic polymerization are uniformly distributed. In the hologram recording, upon exposure of this photosensitive layer 3 to laser interference light (i.e., light of the dual light flux optical system), the first photoinitiator or second photoinitiator in the photosensitive recording material of the photosensitive layer 3 simultaneously generates radical species that activate radical polymerization and Brønsted acid or Lewis acid that activates cationic polymerization, at portions undergoing a strong light interference action among laser irradiated portions. The radical species generated here cause the aliphatic monomers to undergo radical polymerization. As the monomers become polymerized, the photosensitive recording material causes differences in density in the photosensitive layer 3, so that aliphatic monomers move from the neighborhood to those portions. That is, the density of aliphatic monomers becomes higher at the portions undergoing a strong light interference action among laser irradiated portions and the density thereof becomes lower at the portions undergoing a weak light interference action among laser irradiated portions. Thus, differences in refractive index are produced between both the portions to effect hologram recording, as so presumed.

After the exposure to laser interference light, a heat treatment is further applied, whereupon the Brønsted acid or Lewis acid simultaneously generated during the laser interference light irradiation acts to cause the solvent-soluble, thermosetting epoxy oligomer capable of cationic polymerization to undergo the cationic polymerization according to light intensity distribution, so that presumably a structure with different crosslink density is formed and hence this contributes a more increase in the differences in refractive index between the portions undergoing a strong light interference action and the portions undergoing a weak light interference action among the laser irradiated portions, thus making it possible to obtain a volume type phase hologram having a high diffraction efficiency.

The thermosetting epoxy oligomer also serving as an image holding matrix turns to have a cross-linked structure attributable to the cationic polymerization, so that the weatherability and chemical stability of the resulting volume type phase hologram can be improved.

Light sources in the step of interference pattern exposure, usable as the light source suited for the photosensitive recording material of the present invention, include, but are not limited to, a helium cadmium laser, an argon laser, a krypton laser and a helium neon laser.

Thus, the photosensitive recording material according to the present invention can achieve in dry processing a superior sensitivity and resolution in visible light regions, because it comprises as main components the solvent-soluble, thermosetting epoxy oligomer capable of cationic polymerization; the aliphatic monomer having at least one ethylenically unsaturated bond, the monomer being liquid at normal temperature and pressure, having a boiling point of 100° C. or above at normal pressure and being capable of radical polymerization; the photoinitiator selected from the group consisting of i) the first photoinitiator capable of simultaneously generating a radical species that activates radical polymerization and a Brønsted acid or Lewis acid that activates cationic polymerization, upon exposure to actinic radiation, and ii) the second photoinitiator comprised of a radical polymerization photoinitiator capable of generating a radical species that activates radical polymerization upon exposure to actinic radiation and a cationic polymerization photoinitiator capable of generating a Brønsted acid or Lewis acid that activates cationic polymerization upon exposure to actinic radiation; and the spectral sensitizer that sensitizes the first photoinitiator or second photoinitiator; where the aliphatic monomer is mixed in an amount of from 20 to 80 parts by weight based on 100 parts by weight of the thermosetting epoxy oligomer.

Hence, the present invention has the advantage that a volume type phase hologram having superior diffraction efficiency, transparency and weatherability such as thermal resistance and being chemically stable can be produced.

Since also the first photoinitiator or cationic polymerization photoinitiator highly effective for generating the Brønsted acid or Lewis acid is used in combination with the spectral sensitizer, the Brønsted acid or Lewis acid that acts when the thermosetting epoxy oligomer serving as an image holding matrix is made to have a cross-linked structure can be generated in a higher efficiency, so that the diffraction efficiency of the volume type phase hologram after heating can be more improved.

Hence, the present invention has the advantage that it can be applied to photosensitive recording materials suited for producing hologram optical devices required to have a very high performance.

The present invention will be still further described below in greater detail by giving Examples.

EXAMPLE 1

In 100 parts by weight of 2-butanone, 100 parts by weight of a bisphenol-A type epoxy oligomer EPIKOTE 1007 (trade name; available from Yuka Shell Epoxy K.K.; degree of polymerization: n=10.8; epoxy equivalent weight: 1,750–2,100), 50 parts by weight of triethylene glycol diacrylate, 5 parts by weight of diphenyliodonium hexafluorophosphate and 1 part by weight of 3,3'-carbonylbis(7-diethylaminocoumarin) were mixed and dissolved to obtain a photosensitive solution. This photosensitive solution was coated on a glass plate so as to be in a layer thickness of about 15 microns to form a photosensitive layer. Thereafter the surface of the photosensitive layer was covered with a poly(vinyl alcohol) (PVA) film to produce a photosensitive recording medium.

The photosensitive recording medium thus obtained was exposed to light by means of the dual light flux optical system for hologram photographing as shown in FIG. 3, using an argon laser (514.5 nm) as a light source, followed by heating at 100° C. for 30 minutes to produce a hologram.

The diffraction efficiency of the hologram thus obtained was measured using a spectrophotometer manufactured by Nihon Bunko Kogyo K.K. This spectrophotometer is so designed that a photomultimeter with a slit of 3 mm wide can be placed on the area of 20 cm radius in circumference around a sample. The diffraction efficiency was measured by making monochromatic light with a beam width of 0.3 mm incident at an angle of 45 degrees and detecting the light diffracted from the sample. The ratio of the greatest value other than those of specular reflected light to the value measured when the incident light was directly received without placing the sample was regarded as diffraction efficiency. The diffraction efficiency before heating was also measured in the same manner. The results of evaluation of diffraction efficiency are shown in Table 1. In the table, "D.E." and "R.I.C." represent diffraction efficiency and refractive index modulation, respectively.

EXAMPLES 2 to 6

The procedure of Example 1 was repeated to produce holograms except that the triethylene glycol diacrylate (TEGDA) was replaced with diethylene glycol diacrylate (DEGDA), neopentyl glycol diacrylate (NPGDA), ethylcarbitol acrylate (EKA), 1,6-hexanediol diacrylate (HDDA) and triethylene glycol dimethacrylate (TEGDMA), respectively. The diffraction efficiency was also measured similarly. Results of the evalution are shown in Table 1.

TABLE 1

| Example: | Aliphatic monomer | Amount of exposure (mJ/cm$^2$) | Layer thickness (μm) | Before heating D.E. (%) | Before heating R.I.C. (×100) | After heating D.E. (%) | After heating R.I.C. (×100) |
|---|---|---|---|---|---|---|---|
| 1 | TEGDA | 20 | 15.1 | 12.5 | 0.40 | 75.4 | 1.44 |
| 2 | DEGDA | 20 | 17.0 | 25.0 | 0.53 | 89.2 | 1.71 |
| 3 | NPGDA | 20 | 13.1 | 8.7 | 0.38 | 71.9 | 1.56 |
| 4 | EKA | 20 | 14.5 | 10.0 | 0.37 | 77.7 | 1.56 |
| 5 | HDDA | 20 | 15.7 | 15.2 | 0.43 | 81.3 | 1.54 |
| 6 | TEGDMA | 20 | 16.2 | 16.1 | 0.43 | 87.1 | 1.71 |

D.E. and R.I.C. represent diffraction efficiency and refractive index modulation, respectively.

TEGDA: Triethylene glycol diacrylate
DEGDA: Diethylene glycol diacrylate
NPGDA: Neopentyl glycol diacrylate
EKA: Ethylcarbitol acrylate
HDDA: 1,6-Hexanediol diacrylate
TEGDMA: Triethylene glycol dimethacrylate

EXAMPLES 7 to 12

The procedure of Example 1 was repeated to produce holograms except that the bisphenol-A type epoxy oligomer EPIKOTE 1007 (trade name; available from Yuka Shell Epoxy K.K.; degree of polymerization: n=10.8; epoxy equivalent weight: 1,750–2,100) used therein was replaced with EPIKOTE 1001 (EP-1001; trade name; available from Yuka Shell Epoxy K.K.; degree of polymerization: n=2.4; epoxy equivalent weight: 450–500), EPIKOTE 1004 (EP-1004; trade name; available from Yuka Shell Epoxy K.K.; degree of polymerization: n=4.5; epoxy equivalent weight: 900–1,000), EPIKOTE 1009 (EP-1009; trade name; available from Yuka Shell Epoxy K.K.; degree of polymerization: n=14.3; epoxy equivalent weight: 2,400–3,000), ARALDITE 6071 (AR-6071; trade name; available from CIBA-GEIGY (Japan) Limited; degree of polymerization: n=2.4; epoxy equivalent weight: 450–500), ARALDITE 6099 (AR-6099; trade name; available from CIBA-GEIGY (Japan) Limited; degree of polymerization: n=14.3; epoxy equivalent weight: 2,400–3,300) and D.E.R. 668 (DER-668; trade name; available from Dow Chemical Japan Ltd.; degree of polymerization: n=12.5; epoxy equivalent weight: 2,000–3,500), respectively. The diffraction efficiency was also measured similarly. Results of the evalution are shown in Table 2.

TABLE 2

| Example: | Epoxy oligomer | Amount of exposure (mJ/cm²) | Layer thickness (μm) | Before heating D.E. (%) | Before heating R.I.C. (×100) | After heating D.E. (%) | After heating R.I.C. (×100) |
|---|---|---|---|---|---|---|---|
| 7 | EP-1001 | 20 | 15.3 | 14.9 | 0.44 | 83.5 | 1.66 |
| 8 | EP-1004 | 20 | 17.4 | 15.3 | 0.38 | 92.3 | 1.84 |
| 9 | EP-1009 | 20 | 17.1 | 23.1 | 0.50 | 82.1 | 1.44 |
| 10 | AR-6071 | 20 | 15.7 | 15.2 | 0.37 | 81.3 | 1.54 |
| 11 | AR-6099 | 20 | 19.3 | 30.0 | 0.52 | 88.1 | 1.46 |
| 12 | DER-668 | 20 | 15.2 | 15.8 | 0.45 | 85.7 | 1.75 |

D.E. and R.I.C. represent diffraction efficiency and refractive index modulation, respectively.

EP-1001: EPIKOTE 1001, Yuka Shell Epoxy K.K.
EP-1004: EPIKOTE 1004, Yuka Shell Epoxy K.K.
EP-1009: EPIKOTE 1009, Yuka Shell Epoxy K.K.
AR-6071: ARALDITE 6071, CIBA-GEIGY (Japan) Limited
AR-6099: ARALDITE 6099, CIBA-GEIGY (Japan) Limited
DER-668: D.E.R. 668, Dow Chemical Japan Ltd.

EXAMPLES 13 to 18

The procedure of Example 1 was repeated to produce holograms except that the spectral sensitizer 3,3'-carbonylbis(7-diethylaminocoumarin) used therein was replaced with 2-benzoyl-3-(p-dimethylaminophenyl)-2-propenenitrile. The diffraction efficiency was also measured similarly. Results of the evalution are shown in Table 3. At the time of exposure, the argon laser of 514.5 nm was replaced with that of 488 nm.

TABLE 3

| Example: | Aliphatic monomer | Amount of exposure (mJ/cm²) | Layer thickness (μm) | Before heating D.E. (%) | Before heating R.I.C. (×100) | After heating D.E. (%) | After heating R.I.C. (×100) |
|---|---|---|---|---|---|---|---|
| 13 | TEGDA | 30 | 15.5 | 14.5 | 0.40 | 72.7 | 1.27 |
| 14 | DEGDA | 30 | 14.3 | 20.0 | 0.52 | 81.5 | 1.62 |
| 15 | NPGDA | 30 | 16.7 | 12.7 | 0.35 | 74.0 | 1.20 |
| 16 | EKA | 30 | 14.6 | 11.6 | 0.38 | 73.2 | 1.36 |
| 17 | HDDA | 30 | 16.3 | 14.2 | 0.38 | 81.3 | 1.41 |
| 18 | TEGDMA | 30 | 15.1 | 18.1 | 0.47 | 82.1 | 1.55 |

D.E. and R.I.C. represent diffraction efficiency and refractive index modulation, respectively.

TEGDA: Triethylene glycol diacrylate
DEGDA: Diethylene glycol diacrylate
NPGDA: Neopentyl glycol diacrylate
EKA: Ethylcarbitol acrylate
HDDA: 1,6-Hexanediol diacrylate
TEGDMA: Triethylene glycol dimethacrylate

EXAMPLES 19 to 24

The procedure of Example 1 was repeated to produce holograms except that the spectral sensitizer 3,3'-carbonylbis(7-diethylaminocoumarin) used therein was replaced with 3-ethyl-5-[2-(3-ethyl-2-benzothiazolinylidene. The diffraction efficiency was also measured similarly. Results of the evalution are shown in Table 4.

TABLE 4

| Example: | Aliphatic monomer | Amount of exposure (mJ/cm²) | Layer thickness (μm) | Before heating D.E. (%) | Before heating R.I.C. (×100) | After heating D.E. (%) | After heating R.I.C. (×100) |
|---|---|---|---|---|---|---|---|
| 19 | TEGPA | 30 | 14.3 | 15.2 | 0.45 | 75.3 | 1.44 |
| 20 | DEGDA | 30 | 15.3 | 16.6 | 0.44 | 82.3 | 1.53 |
| 21 | NPGDA | 30 | 15.7 | 14.0 | 0.39 | 77.1 | 1.35 |
| 22 | EKA | 30 | 13.8 | 13.2 | 0.43 | 70.1 | 1.36 |
| 23 | HDDA | 30 | 14.5 | 15.0 | 0.44 | 81.2 | 1.58 |
| 24 | TEGDMA | 30 | 14.7 | 16.1 | 0.45 | 79.2 | 1.50 |

D.E. and R.I.C. represent diffraction efficiency and refractive index modulation, respectively.

TEGDA: Triethylene glycol diacrylate
DEGDA: Diethylene glycol diacrylate
NPGDA: Neopentyl glycol diacrylate
EKA: Ethylcarbitol acrylate
HDDA: 1,6-Hexanediol diacrylate
TEGDMA: Triethylene glycol dimethacrylate The holograms according to Examples 1 to 24 caused no lowering of diffraction efficiency even after they were left in an environment of 25° C., 60% RH for 180 days and in an environment of 150° C. for 10 hours.

Comparative Examples 1 to 3

The procedure of Example 1 was repeated to produce holograms except that the bisphenol-A type epoxy oligomer EPIKOTE 1007 (trade name; available from Yuka Shell Epoxy K.K.; degree of polymerization: n=10.8; epoxy equivalent weight: 1,750–2,100) used therein was replaced with EPIKOTE 828 (EP-828; trade name; available from Yuka Shell Epoxy K.K.; degree of polymerization: n=0.23; epoxy equivalent weight: 184–194), ARALDITE GY280 (AR-GY280; trade name; available from CIBA-GEIGY (Japan) Limited; degree of polymerization: n=0.76; epoxy equivalent weight: 225–280) and EPIKOTE 1255HX30 (EP-1255; trade name; available from Yuka Shell Epoxy K.K.; degree of polymerization: n>40; epoxy equivalent weight: 10,000 or more; containing 35% by weight each of n-hexane and xylene), respectively. The diffraction efficiency was also measured similarly. Results of the evalution are shown in Table 5.

| Comparative Example: | Epoxy oligomer | Amount of exposure (mJ/cm²) | Layer thickness (μm) | Before heating D.E. (%) | Before heating R.I.C. (×100) | After heating D.E. (%) | After heating R.I.C. (×100) |
|---|---|---|---|---|---|---|---|
| 1 | EP-828 | 30 | 15.7 | 11.1 | 0.36 | 12.3 | 0.38 |
| 2 | AR-GY280 | 30 | 14.3 | 12.2 | 0.42 | 13.8 | 0.45 |
| 3 | EP1255 | 30 | 15.3 | 8.6 | 0.32 | 9.0 | 0.33 |

D.E. and R.I.C. represent diffraction efficiency and refractive index modulation, respectively.

AR-GY280: ARALDITE GY280, CIBA-GEIGY (Japan) Limited
EP-828: EPIKOTE 828, Yuka Shell Epoxy K.K.
EP-1255: EPIKOTE 1255HX30, Yuka Shell Epoxy K.K.

In these Comparative Examples, the degree of polymerization n was less than 1 or more than 20. Hence, as shown in Table 5, it was ascertained that the diffraction efficiency of each hologram obtained was inferior to that of Examples.

Comparative Examples 4, 5

The procedure of Example 1 was repeated to produce holograms except that the triethylene glycol diacrylate (the aliphatic monomer) used therein was replaced with an aromatic monomer phenoxyethyl acrylate VISCOAT #192 (trade name; available from Osaka Organic Chemical Ind. Co., Ltd.) and benzyl acrylate VISCOAT #160 (trade name; available from Osaka Organic Chemical Ind. Co., Ltd.), respectively.

However, since no aliphatic monomer was used, no hologram was producible in either case.

Comparative Examples 6, 7

The procedure of Example 2 was repeated to produce holograms except that the diethylene glycol diacrylate used therein was added in an amount of 10 or 100 parts by weight (pbw) based on 100 parts by weight of the bisphenol-A type epoxy oligomer EPIKOTE 1007. The diffraction efficiency was also measured similarly. Results of the evalution are shown in Table 6.

| Comparative Example: | Epoxy oligomer EP-1007 | Amount of exposure (mJ/cm$^2$) | Layer thickness ($\mu$m) | Before heating D.E. (%) | Before heating R.I.C. ($\times$100) | After heating D.E. (%) | After heating R.I.C. ($\times$100) |
|---|---|---|---|---|---|---|---|
| 6 | 10 pbw | 30 | 16.2 | 9.2 | 0.32 | Hologram disappeared | |
| 7 | 100 pbw | 30 | 16.5 | 12.1 | 0.36 | 14.2 | 0.39 |

D.E. and R.I.C. represent diffraction efficiency and refractive index modulation, respectively.

Since, however, in each Comparative Example the mixing proportion of the aliphatic monomer based on 100 parts by weight of the thermosetting epoxy oligomer was not set within the range of 20 to 80 parts by weight, it turned out that, as shown in Table 6, in Comparative Example 6 the hologram disappeared after the heating, and in Comparative Example 7 the hologram showed an inferior diffraction efficiency.

Comparative Examples 8 to 13

The procedures of Examples 1 to 6 were respectively repeated to produce holograms except that, after the photosensitive recording mediums were exposed by means of the dual light flux optical system using the argon laser (514.5 nm) as a light source, they were each subjected to overall exposure using a high-pressure mercury lamp under conditions of 100 mJ/cm$^2$, followed by the heat treatment at 100° C. for 30 minutes. The diffraction efficiency was also measured similarly. Results of the evalution are shown in Table 7. It was ascertained from the results that as previously stated, when the exposure to ultraviolet rays or other actinic radiations was carried out before the heat treatment, the heat-curing of epoxy brought about no improvement in diffraction efficiency.

TABLE 7

| Comparative Example: | Aliphatic monomer | Amount of exposure (mJ/cm$^2$) | Layer thickness ($\mu$m) | Before heating D.E. (%) | Before heating R.I.C. ($\times$100) | After heating D.E. (%) | After heating R.I.C. ($\times$100) |
|---|---|---|---|---|---|---|---|
| 8 | TEGDA | 20 | 14.1 | 12.0 | 0.42 | 13.2 | 0.44 |
| 9 | DEGDA | 20 | 15.3 | 17.7 | 0.48 | 18.1 | 0.49 |
| 10 | NPGDA | 20 | 15.7 | 14.0 | 0.41 | 13.7 | 0.41 |
| 11 | EKA | 20 | 13.5 | 8.8 | 0.37 | 10.1 | 0.40 |
| 12 | HDDA | 20 | 14.8 | 14.3 | 0.44 | 14.8 | 0.45 |
| 13 | TEGDMA | 20 | 15.2 | 14.4 | 0.43 | 16.1 | 0.46 |

D.E. and R.I.C. represent diffraction efficiency and refractive index modulation, respectively.
TEGDA: Triethylene glycol diacrylate
DEGDA: Diethylene glycol diacrylate
NPGDA: Neopentyl glycol diacrylate
EKA: Ethylcarbitol acrylate
HDDA: 1,6-Hexanediol diacrylate
TEGDMA: Triethylene glycol dimethacrylate Comparative Example 14

In 100 parts by weight of hydroxypropyl acrylate and 25 parts by weight of 2-butanone, 35 parts by weight of a bisphenol-A type epoxy oligomer EPIKOTE 1001 (EP-1001; trade name; available from Yuka Shell Epoxy K.K.; degree of polymerization: n=2.4; epoxy equivalent weight: 450–500) and 14 parts by weight of an epoxy curing agent FUJICURE FXR-1030 (trade name; available from Fuji Kasei Co., Ltd.) were dissolved to obtain a solution, to which 5 parts by weight of 3,3',4,4'-tetra(tert-butylperoxycarbonyl)benzophenone and 0.2 part by weight of 3,3'-carbonylbis(7-diethylaminocuramrine) were further added to obtain a photosensitive solution. This photosensitive solution was held between two sheets of transparent glass plates to form a photosensitive layer with a layer thickness of 19.5 μm. The photosensitive layer thus obtained was irradiated with ultraviolet rays to carry out pre-polymerization until the layer becomes non-fluid, followed by holographic exposure in the same manner as in Example 1, and also subjected to overall irradiation with ultraviolet rays, followed by heating at 80° C. for 30 hours. As a result, a hologram with a diffraction efficiency of 35.6% (refractive index modulation: 0.0058) was obtained.

On account of such hologram characteristic values (diffraction efficiency: 35.6%; refractive index modulation: 0.0058), it was ascertained that the compositional proportions of materials and production process as disclosed in Japanese Patent Application Laid-open No. 5-94014 could not provide such bright holograms as in Examples of the present invention.

Comparative Example 15

In 100 parts by weight of hydroxypropyl acrylate, 50 parts by weight of a cationic polymerization type ultraviolet-curable epoxy resin OPTOMER KR-600 (trade name; availlable from Asahi Denka Kogyo K.K.) was dissolved to obtain a solution, to which 5 parts by weight of 3,3',4,4'-tetra(tert-butylperoxycarbonyl)benzophenone and 0.2 part by weight of 3,3'-carbonylbis(7-diethylaminocuramrine) were further added to obtain a photosensitive solution.

The subsequent steps of Comparative Example 14 were followed to form a photosensitive layer, which was then subjected to the pre-exposure and the holographic exposure, followed by the overall irradiation with ultraviolet rays. As a result, a hologram with a diffraction efficiency of 42.3% (refractive index modulation: 0.0063; layer thickness: 20.3 μm) was obtained.

On account of such hologram characteristic values (diffraction efficiency: 42.3%; refractive index modulation: 0.0063), it was ascertained that the compositional proportions of materials and production process as disclosed in Japanese Patent Application Laid-open No. 5-94014 could not provide the bright holograms as in Examples of the present invention.

EXAMPLE 25

In 100 parts by weight of 2-butanone, 100 parts by weight of a thermosetting epoxy oligomer (bisphenol-S type; trade name: EBPS300; available from Nippon Kayaku Co., Ltd.), 50 parts by weight of triethylene glycol diacrylate, 5 parts by weight of diphenyliodonium hexafluorophosphate and 1 part by weight of 3,3'-carbonylbis(7-diethylaminocoumarin) were mixed and dissolved to obtain a photosensitive solution. This photosensitive solution was coated on a glass plate by means of an applicator so as to be in a thickness of about 15 microns to form a photosensitive layer. Thereafter the surface of the photosensitive layer was covered with a poly(vinyl alcohol) (PVA) film to produce a photosensitive recording medium according to the present Example.

The photosensitive recording medium thus obtained was exposed to light by means of the dual light flux optical system for hologram photographing as shown in FIG. 3, using an argon laser (514.5 nm) as a light source, to form a hologram image, followed by heating at 100° C. for 30 minutes to obtain a hologram.

The diffraction efficiency of the hologram thus obtained was measured in the same manner as in Example 1. The diffraction efficiency before the heating was also measured similarly. Results of the evaluation are shown in Table 8.

EXAMPLES 26 to 30

The procedure of Example 25 was repeated to produce holograms except that the triethylene glycol diacrylate (TEGDA) was replaced with diethylene glycol diacrylate (DEGDA), neopentyl glycol diacrylate (NPGDA), ethylcarbitol acrylate (EKA), 1,6-hexanediol diacrylate (HDDA) and triethylene glycol dimethacrylate (TEGDMA), respectively. The diffraction efficiency was also measured similarly. The diffraction efficiency before the heating was also measured similarly. Results of the evaluation are shown in Table 8.

TABLE 8

| Example: | Aliphatic monomer | Amount of exposure (mJ/cm²) | Diffraction efficiency (%) | |
|---|---|---|---|---|
| | | | Before heating | After heating |
| 25 | TEGDA | 20 | 15.0 | 81.2 |
| 26 | DEGDA | 20 | 26.7 | 88.0 |
| 27 | NPGDA | 20 | 15.2 | 78.6 |
| 28 | EKA | 20 | 16.8 | 79.2 |
| 29 | HDDA | 20 | 18.0 | 80.9 |
| 30 | TEGDMA | 20 | 21.6 | 85.0 |

TEGDA: Triethylene glycol diacrylate
DEGDA: Diethylene glycol diacrylate
NPGDA: Neopentyl glycol diacrylate
EKA: Ethylcarbitol acrylate
HDDA: 1,6-Hexanediol diacrylate
TEGDMA: Triethylene glycol dimethacrylate

EXAMPLES 31 TO 36

The procedure of Examples 25 to 30 each was repeated to produce holograms except that the thermosetting epoxy oligomer (trade name: EBPS300; available from Nippon Kayaku Co., Ltd.) used therein was replaced with a thermosetting epoxy oligomer ARALDITE PY306 (trade name; available from CIBA-GEIGY (Japan) Limited) to prepare photosensitive solutions, which were then each held between two sheets of glass plates. The diffraction efficiency was also measured similarly. The diffraction efficiency before the heating was also measured similarly. Results of the evalution are shown in Table 9.

TABLE 9

| Example: | Aliphatic monomer | Amount of exposure (mJ/cm²) | Diffraction efficiency (%) | |
|---|---|---|---|---|
| | | | Before heating | After heating |
| 31 | TEGDA | 20 | 10.5 | 71.0 |
| 32 | DEGDA | 20 | 18.2 | 79.6 |
| 33 | NPGDA | 20 | 6.5 | 68.5 |
| 34 | EKA | 20 | 9.2 | 70.2 |
| 35 | HDDA | 20 | 13.8 | 76.2 |
| 36 | TEGDMA | 20 | 17.3 | 78.6 |

TEGDA: Triethylene glycol diacrylate
DEGDA: Diethylene glycol diacrylate
NPGDA: Neopentyl glycol diacrylate
EKA: Ethylcarbitol acrylate
HDDA: 1,6-Hexanediol diacrylate
TEGDMA: Triethylene glycol dimethacrylate

EXAMPLES 37 TO 42

The procedure of Examples 31 to 36 each was repeated to produce holograms except that the thermosetting epoxy oligomer (trade name: ARALDITE PY306; available from CIBA-GEIGY (Japan) Limited) used therein was replaced with a thermosetting epoxy oligomer R-710 (trade name; available from Mitsui Petrochemical Industries, Ltd.). The diffraction efficiency was also measured similarly. The diffraction efficiency before the heating was also measured similarly. Results of the evalution are shown in Table 10.

TABLE 10

| Example: | Aliphatic monomer | Amount of exposure (mJ/cm²) | Diffraction efficiency (%) | |
|---|---|---|---|---|
| | | | Before heating | After heating |
| Example: | | | | |
| 37 | TEGDA | 20 | 11.7 | 76.1 |
| 38 | DEGDA | 20 | 21.0 | 86.2 |
| 39 | NPGDA | 20 | 10.6 | 71.2 |
| 40 | EKA | 20 | 12.6 | 74.9 |
| 41 | HDDA | 20 | 12.1 | 78.6 |
| 42 | TEGDMA | 20 | 18.3 | 81.8 |

TEGDA: Triethylene glycol diacrylate
DEGDA: Diethylene glycol diacrylate
NPGDA: Neopentyl glycol diacrylate
EKA: Ethylcarbitol acrylate
HDDA: 1,6-Hexanediol diacrylate
TEGDMA: Triethylene glycol dimethacrylate

EXAMPLES 43 TO 45

The procedure of Example 25 was repeated to produce holograms except that, the thermosetting epoxy oligomer (trade name: EBPS300; available from Nippon Kayaku Co., Ltd.) used therein was replaced with 100 parts by weight a novolak type thermosetting epoxy oligomer (trade name: EPPN-201; available from Nippon Kayaku Co., Ltd.), a brominated novolak type thermosetting epoxy oligomer (trade name: BREN-S; available from Nippon Kayaku Co., Ltd.) and an o-cresol novolak type thermosetting epoxy oligomer (trade name: EOCN-104; available from Nippon Kayaku Co., Ltd.), respectively, and the components were dissolved in 100 parts by weight of methyl ethyl ketone to obtain photosensitive solutions. The diffraction efficiency was also measured similarly. The diffraction efficiency before the heating was also measured similarly. Results of the evalution are shown in Table 11.

TABLE 11

| Example: | Thermosetting epoxy oligomer | Amount of exposure (mJ/cm$^2$) | Diffraction efficiency (%) | |
|---|---|---|---|---|
| | | | Before heating | After heating |
| 43 | EPPN-201 | 20 | 15.0 | 81.2 |
| 44 | BREN-S | 20 | 26.7 | 88.0 |
| 45 | EOCN-104 | 20 | 15.2 | 78.6 |

EXAMPLES 46 TO 51

The procedure of Example 25 to 30 each was repeated to produce holograms except that the spectral sensitizer 3,3'-carbonylbis(7-diethylaminocoumarin) used therein was replaced with 2-benzoyl-3-(p-dimethylaminophenyl)-2-propenenitrile. The diffraction efficiency was also measured similarly. The diffraction efficiency before the heating was also measured similarly. Results of the evalution are shown in Table 12. At the time of exposure, the argon laser of 514.5 nm was replaced with that of 488 nm.

TABLE 12

| Example: | Aliphatic monomer | Amount of exposure (mJ/cm$^2$) | Diffraction efficiency (%) | |
|---|---|---|---|---|
| | | | Before heating | After heating |
| 46 | TEGDA | 30 | 8.2 | 65.0 |
| 47 | DEGDA | 30 | 15.7 | 74.3 |
| 48 | NPGDA | 30 | 5.9 | 65.2 |
| 49 | EKA | 30 | 8.1 | 67.3 |
| 50 | HDDA | 30 | 11.6 | 70.6 |
| 51 | TEGDMA | 30 | 15.3 | 71.7 |

TEGDA: Triethylene glycol diacrylate
DEGDA: Diethylene glycol diacrylate
NPGDA: Neopentyl glycol diacrylate
EKA: Ethylcarbitol acrylate
HDDA: 1,6-Hexanediol diacrylate
TEGDMA: Triethylene glycol dimethacrylate The holograms according to Examples 25 to 51 caused no lowering of diffraction efficiency even after they were left in an environment of 25° C., 60% RH for 180 days and in an environment of 150° C. for 10 hours.

EXAMPLE 52

In 100 parts by weight of 2-butanone, 100 parts by weight of a bisphenol-A type epoxy oligomer EPIKOTE 1007 (trade name; available from Yuka Shell Epoxy K.K.; degree of polymerization: n=10.8; epoxy equivalent weight: 1,750–2,100), 50 parts by weight of triethylene glycol diacrylate, 5 parts by weight of an iron arene complex (hexafluorophosphate) and 1 part by weight of 3,3'-carbonylbis(7-diethylaminocoumarin) were mixed and dissolved to obtain a photosensitive solution. This photosensitive solution was coated on a glass plate so as to be in a layer thickness of about 15 microns to form a photosensitive layer. Thereafter the surface of the photosensitive layer was covered with a poly(vinyl alcohol) (PVA) film to produce a photosensitive recording medium.

The photosensitive recording medium thus obtained was exposed to light by means of the dual light flux optical system for hologram photographing as shown in FIG. 3, using an argon laser (488 nm) as a light source, followed by heating at 100° C. for 30 minutes to obtain a hologram.

The diffraction efficiency of the hologram thus obtained was measured in the same manner as in Example 1. The diffraction efficiency before the heating was also measured similarly. Results of the evaluation are shown in Table 13.

EXAMPLES 53 TO 57

The procedure of Example 52 was repeated to produce holograms except that the triethylene glycol diacrylate (TEGDA) was replaced with diethylene glycol diacrylate (DEGDA), neopentyl glycol diacrylate (NPGDA), ethylcarbitol acrylate (EKA), 1,6-hexanediol diacrylate (HDDA) and triethylene glycol dimethacrylate (TEGDMA), respectively. The diffraction efficiency was also measured similarly. The diffraction efficiency before the heating was also measured similarly. Results of the evalution are shown in Table 13.

TABLE 13

| Example: | Aliphatic monomer | Amount of exposure (mJ/cm$^2$) | Diffraction efficiency (%) | |
|---|---|---|---|---|
| | | | Before heating | After heating |
| 52 | TEGDA | 25 | 10.2 | 71.7 |
| 53 | DEGDA | 25 | 17.5 | 81.6 |
| 54 | NPGDA | 25 | 7.8 | 69.2 |
| 55 | EKA | 25 | 8.4 | 69.0 |
| 56 | HDDA | 25 | 11.9 | 74.9 |
| 57 | TEGDMA | 25 | 19.6 | 77.7 |

TEGDA: Triethylene glycol diacrylate
DEGDA: Diethylene glycol diacrylate
NPGDA: Neopentyl glycol diacrylate
EKA: Ethylcarbitol acrylate
HDDA: 1,6-Hexanediol diacrylate
TEGDMA: Triethylene glycol dimethacrylate

EXAMPLES 58 TO 63

The procedure of Example 52 was repeated to produce holograms except that the bisphenol-A type epoxy oligomer EPIKOTE 1007 (trade name; available from Yuka Shell Epoxy K.K.; degree of polymerization: n=10.8; epoxy equivalent weight: 1,750–2,100) used therein was replaced with EPIKOTE 1001 (EP-1001; trade name; available from Yuka Shell Epoxy K.K.; degree of polymerization: n=2.4; epoxy equivalent weight: 450–500), EPIKOTE 1004 (EP-1004; trade name; available from Yuka Shell Epoxy K.K.; degree of polymerization: n=4.5; epoxy equivalent weight: 900–1,000), EPIKOTE 1009 (EP-1009; trade name; available from Yuka Shell Epoxy K.K.; degree of polymerization: n=14.3; epoxy equivalent weight: 2,400–3,000), ARALDITE 6071 (AR-6071; trade name; available from CIBA-GEIGY (Japan) Limited; degree of polymerization: n=2.4; epoxy equivalent weight: 450–500), ARALDITE 6099 (AR-6099; trade name; available from CIBA-GEIGY (Japan) Limited; degree of polymerization: n=14.3; epoxy equivalent weight: 2,400–3,300) and D.E.R. 668 (DER-668; trade name; available from Dow Chemical Japan Ltd.; degree of polymerization: n=12.5; epoxy equivalent weight: 2,000–3,500), respectively. The diffraction efficiency was also measured similarly. Results of the evalution are shown in Table 14.

TABLE 14

| Example: | Thermo-setting epoxy oligomer | Amount of exposure (mJ/cm$^2$) | Diffraction efficiency (%) | |
|---|---|---|---|---|
| | | | Before heating | After heating |
| 58 | EP-1001 | 20 | 11.7 | 76.1 |
| 59 | EP-1004 | 20 | 21.0 | 86.5 |
| 60 | EP-1009 | 20 | 10.6 | 71.2 |
| 61 | AR-6071 | 20 | 12.6 | 74.9 |
| 62 | AR-6099 | 20 | 12.1 | 78.6 |
| 63 | DER-668 | 20 | 18.3 | 81.8 |

EP-1001: EPIKOTE 1001, Yuka Shell Epoxy K.K.
EP-1004: EPIKOTE 1004, Yuka Shell Epoxy K.K.
EP-1009: EPIKOTE 1009, Yuka Shell Epoxy K.K.
AR-6071: ARALDITE 6071, CIBA-GEIGY (Japan) Limited
AR-6099: ARALDITE 6099, CIBA-GEIGY (Japan) Limited
DER-668: D.E.R. 668, Dow Chemical Japan Ltd.

EXAMPLES 64 TO 69

The procedure of Examples 52 to 57 each was repeated to produce holograms except that the photoinitiator iron arene complex (hexafluorophosphate) used in Example 52 was replaced with 1,3,5-trichloromethyltriazine. The diffraction efficiency was also measured similarly. The diffraction efficiency before the heating was also measured similarly. Results of the evalution are shown in Table 15.

TABLE 15

| Example: | Aliphatic monomer | Amount of exposure (mJ/cm$^2$) | Diffraction efficiency (%) | |
|---|---|---|---|---|
| | | | Before heating | After heating |
| 64 | TEGDA | 20 | 10.2 | 72.3 |
| 65 | DEGDA | 20 | 14.3 | 84.2 |
| 66 | NPGDA | 20 | 9.5 | 71.0 |
| 67 | EKA | 20 | 8.7 | 68.4 |
| 68 | HDDA | 20 | 10.5 | 75.0 |
| 69 | TEGDMA | 20 | 18.0 | 75.3 |

TEGDA: Triethylene glycol diacrylate
DEGDA: Diethylene glycol diacrylate
NPGDA: Neopentyl glycol diacrylate
EKA: Ethylcarbitol acrylate
HDDA: 1,6-Hexanediol diacrylate
TEGDMA: Triethylene glycol dimethacrylate

EXAMPLES 70 TO 74

The procedure of Example 53 was repeated to produce holograms except that the spectral sensitizer 3,3'-carbonylbis(7-diethylaminocoumarin) used therein was replaced with Rose Bengale (RB), 4,4'-dimethylaminochalcone (DMAC), 4,4'-bis(dimethylamino) benzalacetone (BDMABA), 3,3'-diethyl-2,2'-oxacarbocyanine iodide (DEOCCI) and 2,4,6-triphenylthiapyrylium perchlorate (TPTPPC), respectively. The diffraction efficiency was also measured similarly. The diffraction efficiency before the heating was also measured similarly. Results of the evalution are shown in Table 16. At the time of exposure, the argon laser of 514.5 nm was replaced with that of 488 nm.

TABLE 16

| Example: | Sensitizer | Amount of exposure (mJ/cm$^2$) | Diffraction efficiency (%) | |
|---|---|---|---|---|
| | | | Before heating | After heating |
| 70 | RB | 30 | 8.2 | 65.0 |
| 71 | DMAC | 30 | 15.7 | 74.3 |
| 72 | BDMABA | 30 | 5.9 | 65.2 |
| 73 | DEOCCI | 30 | 8.1 | 67.3 |
| 74 | TPTPPC | 30 | 11.6 | 70.6 |

RB: Rose Bengale
DMAC: 4,4'-Dimethylaminochalcone
BDMABA: 4,4'-Bis(dimethylamino)benzalacetone
DEOCCI: 3,3'-Diethyl-2,2'-oxacarbocyanine iodide
TPTPPC: 2,4,6-Triphenylthiapyrylium perchlorate The holograms according to Examples 52 to 74 also caused no lowering of diffraction efficiency even after they were left in an environment of 25° C., 60% RH for 180 days and in an environment of 150° C. for 10 hours.

EXAMPLE 75

In 100 parts by weight of 2-butanone, 100 parts by weight of a bisphenol-A type epoxy oligomer EPIKOTE 1007 (trade name; available from Yuka Shell Epoxy K.K.; degree of polymerization: n=10.8; epoxy equivalent weight: 1,750–2,100), 50 parts by weight of triethylene glycol diacrylate, 5 parts by weight of 2,2',5,5'-tetra(tert-butylperoxycarbonyl)benzophenone (a radical polymerization photoinitiator), 3 parts by weight of p-nitrobenzyl-9,10-dianthacene-2-sulfonate (cationic polymerization photoinitiator) and 1 part by weight of 3,3'-carbonylbis(7-diethylaminocoumarin) were mixed and dissolved to obtain a photosensitive solution. This photosensitive solution was coated on a glass plate so as to be in a layer thickness of about 15 microns to form a photosensitive layer. Thereafter the surface of the photosensitive layer was covered with a poly(vinyl alcohol) (PVA) film to produce a photosensitive recording medium.

The photosensitive recording medium thus obtained was exposed to light by means of the dual light flux optical system for hologram photographing as shown in FIG. 3, using an argon laser (488 nm) as a light source, followed by heating at 100° C. for 30 minutes to obtain a hologram.

The diffraction efficiency of the hologram thus obtained was measured in the same manner as in Example 1. The diffraction efficiency before the heating was also measured similarly. Results of the evaluation are shown in Table 17.

EXAMPLES 76 TO 80

The procedure of Example 75 was repeated to produce holograms except that the triethylene glycol diacrylate (TEGDA) was replaced with diethylene glycol diacrylate (DEGDA), neopentyl glycol diacrylate (NPGDA), ethylcarbitol acrylate (EKA), 1,6-hexanediol diacrylate (HDDA) and triethylene glycol dimethacrylate (TEGDMA), respectively. The diffraction efficiency was also measured similarly. The diffraction efficiency before the heating was also measured similarly. Results of the evaluation are shown in Table 17.

TABLE 17

| Example: | Aliphatic monomer | Amount of exposure (mJ/cm$^2$) | Diffraction efficiency (%) | |
|---|---|---|---|---|
| | | | Before heating | After heating |
| 75 | TEGDA | 25 | 10.1 | 70.2 |
| 76 | DEGDA | 25 | 16.2 | 83.6 |
| 77 | NPGDA | 25 | 5.9 | 64.5 |
| 78 | EKA | 25 | 8.9 | 66.2 |
| 79 | HDDA | 25 | 10.9 | 72.6 |
| 80 | TEGDMA | 25 | 17.2 | 74.9 |

TEGDA: Triethylene glycol diacrylate
DEGDA: Diethylene glycol diacrylate
NPGDA: Neopentyl glycol diacrylate
EKA: Ethylcarbitol acrylate
HDDA: 1,6-Hexanediol diacrylate
TEGDMA: Triethylene glycol dimethacrylate

EXAMPLES 81 TO 86

The procedure of Example 75 was repeated to produce holograms except that the bisphenol-A type epoxy oligomer EPIKOTE 1007 (trade name; available from Yuka Shell Epoxy K.K.; degree of polymerization: n=10.8; epoxy equivalent weight: 1,750-2,100) used therein was replaced with EPIKOTE 1001 (EP-1001; trade name; available from Yuka Shell Epoxy K.K.; degree of polymerization: n=2.4; epoxy equivalent weight: 450-500), EPIKOTE 1004 (EP-1004; trade name; available from Yuka Shell Epoxy K.K.; degree of polymerization: n=4.5; epoxy equivalent weight: 900-1,000), EPIKOTE 1009 (EP-1009; trade name; available from Yuka Shell Epoxy K.K.; degree of polymerization: n=14.3; epoxy equivalent weight: 2,400-3,000), ARALDITE 6071 (AR-6071; trade name; available from CIBA-GEIGY (Japan) Limited; degree of polymerization: n=2.4; epoxy equivalent weight: 450-500), ARALDITE 6099 (AR-6099; trade name; available from CIBA-GEIGY (Japan) Limited; degree of polymerization: n=14.3; epoxy equivalent weight: 2,400-3,300) and D.E.R. 668 (DER-668; trade name; available from Dow Chemical Japan Ltd.; degree of polymerization: n=12.5; epoxy equivalent weight: 2,000-3,500), respectively. The diffraction efficiency was also measured similarly. Results of the evaluation are shown in Table 18.

TABLE 18

| Example: | Thermo-setting epoxy oligomer | Amount of exposure (mJ/cm$^2$) | Diffraction efficiency (%) | |
|---|---|---|---|---|
| | | | Before heating | After heating |
| 81 | EP-1001 | 20 | 9.9 | 72.1 |
| 82 | EP-1004 | 20 | 16.3 | 79.0 |
| 83 | EP-1009 | 20 | 19.2 | 82.9 |
| 84 | AR-6011 | 20 | 11.6 | 70.8 |
| 85 | AR-6099 | 20 | 11.7 | 75.9 |
| 86 | DER-668 | 20 | 15.6 | 76.3 |

EP-1001: EPIKOTE 1001, Yuka Shell Epoxy K.K.
EP-1004: EPIKOTE 1004, Yuka Shell Epoxy K.K.
EP-1009: EPIKOTE 1009, Yuka Shell Epoxy K.K.
AR-6071: ARALDITE 6071, CIBA-GEIGY (Japan) Limited
AR-6099: ARALDITE 6099, CIBA-GEIGY (Japan) Limited
DER-668: D.E.R. 668, Dow Chemical Japan Ltd.

EXAMPLES 87 TO 92

The procedure of Examples 75 to 80 each was repeated to produce holograms except that the cationic polymerization photoinitiator p-nitrobenzyl-9,10-dianthacene-2-sulfonate used in Example 75 was replaced with DNB-105 (a sulfonic acid ester, available from Midori Kagaku Co., Ltd. ). The diffraction efficiency was also measured similarly. The diffraction efficiency before the heating was also measured similarly. Results of the evaluation are shown in Table 19.

TABLE 19

| Example | Aliphatic monomer | Amount of exposure (mJ/cm$^2$) | Diffraction efficiency (%) | |
|---|---|---|---|---|
| | | | Before heating | After heating |
| 87 | TEGDA | 20 | 10.1 | 72.9 |
| 88 | DEGDA | 20 | 12.3 | 89.2 |
| 89 | NPGDA | 20 | 10.6 | 78.9 |
| 90 | EKA | 20 | 8.3 | 67.4 |
| 91 | HDDA | 20 | 9.3 | 71.0 |
| 92 | TEGDMA | 20 | 9.9 | 70.3 |

TEGDA: Triethylene glycol diacrylate
DEGDA: Diethylene glycol diacrylate
NPGDA: Neopentyl glycol diacrylate
EKA: Ethylcarbitol acrylate
HDDA: 1,6-Hexanediol diacrylate
TEGDMA: Triethylene glycol dimethacrylate

EXAMPLES 93 TO 97

The procedure of Example 76 was repeated to produce holograms except that the spectral sensitizer 3,3'-carbonylbis(7-diethylaminocoumarin) used therein was replaced with Rose Bengale (RB), 4,4'-dimethylaminochalcone (DMAC), 4,4'-bis(dimethylamino)benzalacetone (BDMABA), 3,3'-diethyl-2,2'-oxacarbocyanine iodide (DEOCCI) and 2,4,6-triphenylthiapyrylium perchlorate (TPTPPC), respectively. The diffraction efficiency was also measured similarly. The diffraction efficiency before the heating was also measured similarly. Results of the evalution are shown in Table 20.

TABLE 20

| Example: | Sensitizer | Amount of exposure (mJ/cm$^2$) | Diffraction efficiency (%) | |
|---|---|---|---|---|
| | | | Before heating | After heating |
| 93 | RB | 30 | 8.2 | 65.1 |
| 94 | DMAC | 30 | 9.7 | 74.8 |
| 95 | BDMABA | 30 | 8.9 | 65.9 |
| 96 | DEOCCI | 30 | 8.1 | 67.3 |
| 97 | TPTPPC | 40 | 8.6 | 70.7 |

RB: Rose Bengale
DMAC: 4,4'-Dimethylaminochalcone
BDMABA: 4,4'-Bis(dimethylamino)benzalacetone
DEOCCI: 3,3'-Diethyl-2,2'-oxacarbocyanine iodide
TPTPPC: 2,4,6-Triphenylthiapyrylium perchlorate The holograms according to Examples 75 to 97 caused no lowering of diffraction efficiency even after they were left in an environment of 25° C., 60% RH for 180 days and in an environment of 150° C. for 10 hours.

What is claimed is:

1. A photosensitive recording material for use in producing a volume type phase hologram, comprising:

a solvent-soluble, cationic-polymerizable thermosetting bisphenol A type epoxy oligomer, the bisphenol A type epoxy oligomer being represented by Formula V:

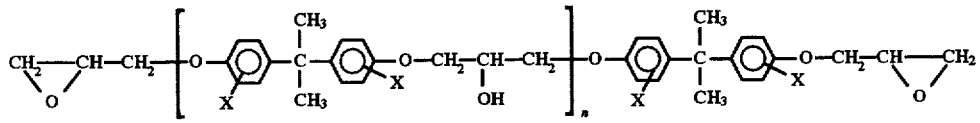

wherein X represents a hydrogen atom or a halogen atom, and n is 1 to 20;

and having an epoxy equivalent weight of 400 to 6,000 and a melting point of 60° C. or above;

a radical-polymerizable aliphatic monomer having at least one ethylenically unsaturated bond, the aliphatic monomer being liquid at normal temperature and pressure and having a boiling point of 100° C. or above at normal pressure;

a photoinitiator system selected from the group consisting of i) a first photoinitiator compound which simultaneously generates a radical species that activates radical polymerization and a Brønsted acid or Lewis acid that activates cationic polymerization, upon exposure to a visible light ray in the presence of a spectral sensitizer and upon subsequent sensitization by the action of the latter, and ii) a second photoinitiator comprised of a mixture of a radical polymerization photoinitiator which generates a radical species that activates radical polymerization, upon exposure to the visible light ray in the presence of a spectral sensitizer and upon subsequent sensitization by the action of the latter, and a cationic polymerization photoinitiator which generates a Brønsted acid or Lewis acid that activates cationic polymerization, upon exposure to the visible light ray in the presence of a spectral sensitizer and upon subsequent sensitization by the action of the latter; and said spectral sensitizer acting to absorb said visible light ray and to sensitize said first photoinitiator compound or said second photoinitiator, said aliphatic monomer being mixed in an amount of from 20 parts by weight to 80 parts by weight based on 100 parts by weight of said thermosetting bisphenol A type epoxy oligomer.

2. The photosensitive recording material for use in producing a volume type phase hologram according to claim 1, wherein said aliphatic monomer is mixed in an amount of from 40 parts by weight to 70 parts by weight based on 100 parts by weight of said thermosetting bisphenol A type epoxy oligomer.

3. The photosensitive recording material for use in producing a volume type phase hologram according to claim 1 or 2, wherein said aliphatic monomer is a polyethylene glycol diacrylate or -methacrylate, or propylene glycol diacrylate or -methacrylate represented by Formula VI:

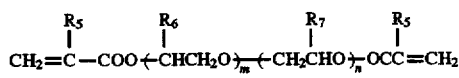

wherein $R_5$ to $R_7$ each represent a hydrogen atom or a methyl group, m and n each are 0 or more, and m+n is 1 to 20.

4. The photosensitive recording material for use in producing a volume type phase hologram according to claim 1 or 2, wherein said first photoinitiator compound is selected from the group consisting of an iron arena complex, a trihalogenomethyl-substituted s-triazine, a sulfonium salt, a diazonium salt, an iodonium salt, a phosphonium salt, a selenonium salt and an arsonium salt.

5. The photosensitive recording material for use in producing a volume type phase hologram according to claim 1 or 2, wherein said spectral sensitizer is a visible light ray-absorptive organic compound selected from the group consisting of a cyanine compound, a merocyanine compound, a coumarin compound, a chalcone compound, e xanthene compound, a thioxanthene compound, an azulenium compound, a squarilium compound, a tetraphenylporphyrin compound, a tetrabenzoporphyrin compound and a tetrapyrazino compound.

6. A photosensitive recording medium for use in producing a volume type phase hologram, comprising:

a substrate;

a photosensitive layer formed by coating on the substrate a photosensitive solution comprising photosensitive recording material, followed by drying, said photosensitive recording material comprising: a solvent-soluble, cationic-polymerizable thermosetting bisphenol A type epoxy oligomer, the bisphenol A type epoxy oligomer being represented by Formula V:

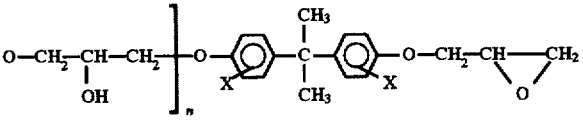

wherein X represents a hydrogen atom or a halogen atom, and n is 1 to 20; and having an epoxy equivalent weight of 400 to 6,000 and a melting point of 60° C. or above; a radical-polymerizable aliphatic monomer having at least one ethylenically unsaturated bond, the aliphatic monomer being liquid at normal temperature and pressure and having a boiling point of 100° C. or above at normal pressure; a photoinitiator system selected from the group consisting of i) a first photoinitiator compound which simultaneously generates a radical species that activates radical polymerization and a Brønsted acid or Lewis acid that activates cationic polymerization, upon exposure to a visible light ray in the presence of a spectral sensitizer and upon subsequent sensitization by the action of the latter, and ii) a second photoinitiator comprised of a mixture of a radical polymerization photoinitiator which generates a radical species that activates radical polymerization, upon exposure to the visible light ray in the presence of a spectral sensitizer and upon subsequent sensitization by the action of the latter, and a cationic polymerization photoinitiator which generates a Brønsted acid or Lewis acid that activates cationic polymerization, upon exposure to the visible light ray in the presence of a spectral sensitizer and upon subsequent sensitization by the action of the latter; and said spectral sensitizer acting to absorb said visible light ray and to sensitize said first photoinitiator compound or said second photoinitiator; said aliphatic monomer being mixed in an amount of from 20 parts by weight to 80 parts by weight based on 100 parts by weight of said thermosetting bisphenol A type epoxy oligomer; and an oxygen barrier layer provided on the photosensitive layer.

7. The photosensitive recording medium for use in producing a volume type phase hologram according to claim 6, wherein said aliphatic monomer is mixed in an amount of from 40 parts by weight to 70 parts by weight based on 100 parts by weight of said thermosetting bisphenol A type epoxy oligomer.

8. The photosensitive recording medium for use in producing a volume type phase hologram according to claim 6 or 7, wherein said aliphatic monomer is a polyethylene glycol diacrylate or -methacrylate, or propylene glycol diacrylate or -methacrylate represented by Formula VI:

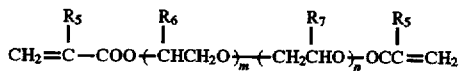

wherein $R_5$ to $R_7$ each represent a hydrogen atom or a methyl group, m and n each are 0 or more, and m+n is 1 to 20.

9. The photosensitive recording medium for use in producing a volume type phase hologram according to claim 6 or 7, wherein said first photoinitiator compound is selected from the group consisting of an iron arene complex, a trihalogenomethyl-substituted s-triazine, a sulfonium salt, a diazonium salt, an iodonium salt, a phosphonium salt, a selenonium salt and an arsonium salt.

10. The photosensitive recording medium for use in producing a volume type phase hologram according to claim 6 or 7, wherein said spectral sensitizer is a visible light ray-absorptive organic compound selected from the group consisting of a cyanine compound, a merocyanine compound, a coumarin compound, a chalcone compound, a xanthene compound, a thioxanthene compound, an azulenium compound, a squarilium compound, a tetraphenylporphyrin compound, a tetrabenzoporphyrin compound and a tetrapyrazino compound.

11. A process for producing a volume type phase hologram, comprising the steps of:

subjecting a photosensitive layer of a photosensitive recording medium to holographic exposure to a visible light ray as a light source to form a latent image, substantially directly followed by heating at a temperature of from 60° C. to 120° C. for 1 minute to 30 minutes to produce a volume type phase hologram, said photosensitive recording medium comprising:

a substrate;

a photosensitive layer formed by coating on the substrate a photosensitive solution comprising a photosensitive recording material, followed by drying, said photosensitive recording material comprising: a solvent-soluble, cationic-polymerizable thermosetting bisphenol A type epoxy oligomer, the bisphenol A type epoxy oligomer being represented by Formula V:

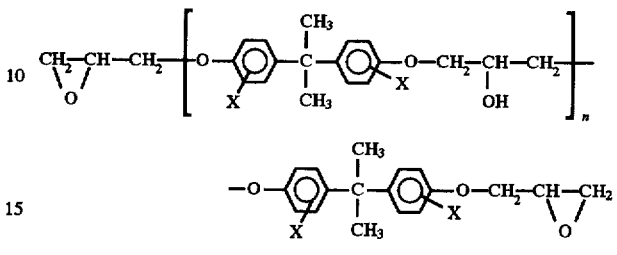

wherein X represents a hydrogen atom or a halogen atom, and n is 1 to 20; and having an epoxy equivalent weight of 400 to 6,000 and a melting point of 60° C. or above; a radical-polymerizable aliphatic monomer having at least one ethylenically unsaturated bond, the aliphatic monomer being liquid at normal temperature and pressure and having a boiling point of 100° C. or above at normal pressure; a photoinitiator system selected from the group consisting of i) a first photoinitiator compound which simultaneously generates a radical species that activates radical polymerization and a Brønsted acid or Lewis acid that activates cationic polymerization, upon exposure to a visible light ray in the presence of a spectral sensitizer and upon subsequent sensitization by the action of the latter, and ii) a second photoinitiator comprised of a mixture of a radical polymerization photoinitiator which generates a radical species that activates radical polymerization, upon exposure to the visible light ray in the presence of a spectral sensitizer and upon subsequent sensitization by the action of the latter, and a cationic polymerization photoinitiator which generates a Brønsted acid or Lewis acid that activates cationic polymerization, upon exposure to the visible light ray in the presence of a spectral sensitizer and upon subsequent sensitization by the action of the latter; and said spectral sensitizer acting to absorb said visible light ray and to sensitize said first photoinitiator compound or said second photoinitiator; said aliphatic monomer being mixed in an amount of from 20 parts by weight to 80 parts by weight based on 100 parts by weight of said thermosetting bisphenol A type epoxy oligomer; and an oxygen barrier layer provided on the photosensitive layer.

12. The process for producing a volume type phase hologram according to claim 11, wherein said aliphatic monomer is mixed in an amount of from 40 parts by weight to 70 parts by weight based on 100 parts by weight of said thermosetting bisphenol A type epoxy oligomer.

13. The process for producing a volume type phase hologram according to claim 11 or 12, wherein said aliphatic monomer is a polyethylene glycol diacrylate or -methacrylate, or propylene glycol diacrylate or -methacrylate represented by Formula VI:

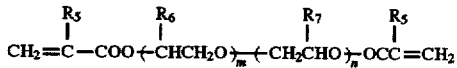

wherein $R_5$ to $R_7$ each represent a hydrogen atom or a methyl group, m and n each are 0 or more, and m+n is 1 to 20.

14. The process for producing a volume type phase hologram according to claim 11 or 12, wherein said first photoinitiator compound is selected from the group consisting of an iron arene complex, a trihalogenomethyl-substituted s-triazine, a sulfonium salt, a diazonium salt, an iodonium salt, a phosphonium salt, a selenonium salt and an arsonium salt.

15. The process for producing a volume type phase hologram according to claim 11 or 12, wherein said spectral sensitizer is a visible light ray-absorptive organic compound selected from the group consisting of a cyanine compound, a merocyanine compound, a coumarin compound, a chalcone compound, a xanthene compound, a thioxenthene compound, an azulenium compound, a squarilium compound, a tetraphenylporphyrin compound, a tetrabenzoporphyrin compound and a tetrapyrazino compound.

* * * * *